United States Patent
Kim et al.

(10) Patent No.: US 9,431,583 B2
(45) Date of Patent: Aug. 30, 2016

(54) SEMICONDUCTOR LIGHT EMITTING DEVICE

(71) Applicant: SAMSUNG ELECTRONICS CO., LTD., Suwon-si, Gyeonggi-do (JP)

(72) Inventors: Tae Gyu Kim, Hwaseong-si (KR); Tai Oh Chung, Suwon-si (KR); Hyoung Cheol Cho, Seoul (KR); Min Soo Han, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/512,163

(22) Filed: Oct. 10, 2014

(65) Prior Publication Data
US 2015/0200338 A1   Jul. 16, 2015

(30) Foreign Application Priority Data

Jan. 13, 2014   (KR) .................. 10-2014-0004205

(51) Int. Cl.
*H01L 33/00* (2010.01)
*H01L 33/50* (2010.01)
*H01L 27/15* (2006.01)
(Continued)

(52) U.S. Cl.
CPC ............... *H01L 33/50* (2013.01); *H01L 24/97* (2013.01); *H01L 27/15* (2013.01); *H01L 33/36* (2013.01); *H01L 33/44* (2013.01); *H01L 33/60* (2013.01); *H01L 33/24* (2013.01); *H01L 2224/16225* (2013.01); *H01L 2924/12041* (2013.01); *H01L 2924/12042* (2013.01)

(58) Field of Classification Search
CPC ....... H01L 33/50; H01L 24/97; H01L 27/15; H01L 33/36; H01L 33/60; H01L 2224/16225; H01L 33/505; H01L 22/508
USPC .................. 257/79–106, 797; 438/22–47
See application file for complete search history.

(56) References Cited

U.S. PATENT DOCUMENTS 5,210,411 A * 5/1993 Oshima .................. G06K 7/12
235/462.18
6,372,608 B1   4/2002 Shimoda et al.
(Continued)

FOREIGN PATENT DOCUMENTS

JP   2009-130237 A   6/2009
JP   2009-152482 A   7/2009
(Continued)

OTHER PUBLICATIONS

JP2010-199487 (English translation).*
(Continued)

*Primary Examiner* — Jessica Stultz
*Assistant Examiner* — Delma R Forde
(74) *Attorney, Agent, or Firm* — Lee & Morse, P.C.

(57) ABSTRACT

A light emitting device is provide comprising a light emitting diode (LED) chip having a first main surface and a second main surface opposing the first main surface, and one or more side surfaces extending between the first main surface and second main surface. A plurality of electrodes is disposed on the first main surface. A wavelength conversion film is disposed on the second main surface. A mark is formed in the wavelength conversion film. The mark contains orientation information of the light emitting device, thereby enabling the light emitting device to be properly oriented on a receiving substrate.

13 Claims, 18 Drawing Sheets

(51) Int. Cl.
*H01L 33/36* (2010.01)
*H01L 33/60* (2010.01)
*H01L 23/00* (2006.01)
*H01L 33/44* (2010.01)
*H01L 33/24* (2010.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,777,719 B1 | 8/2004 | Fujii |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,227,271 B1 | 7/2012 | Ho |
| 8,263,987 B2 | 9/2012 | Choi et al. |
| 8,324,646 B2 | 12/2012 | Lee et al. |
| 8,338,841 B2 | 12/2012 | Lerman et al. |
| 8,350,251 B1 | 1/2013 | Lowgren et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2010/0119839 A1 | 5/2010 | Chen |
| 2011/0049545 A1 | 3/2011 | Basin et al. |
| 2012/0074438 A1 | 3/2012 | Hwang et al. |
| 2012/0286311 A1* | 11/2012 | Margalit ............ H01L 33/58 257/98 |
| 2012/0319575 A1 | 12/2012 | Nakamura et al. |
| 2013/0026518 A1 | 1/2013 | Suh et al. |
| 2013/0029439 A1 | 1/2013 | Song et al. |
| 2013/0069525 A1* | 3/2013 | Imai ............... H01L 24/97 313/512 |
| 2013/0105829 A1 | 5/2013 | Bisberg |
| 2013/0149508 A1 | 6/2013 | Kwak et al. |
| 2013/0217160 A1 | 8/2013 | Chen et al. |
| 2014/0210338 A1 | 7/2014 | Matsumura et al. |
| 2015/0207046 A1* | 7/2015 | Ikegami ........... H01L 33/507 257/98 |

FOREIGN PATENT DOCUMENTS

| | | |
|---|---|---|
| JP | 2012-044037 A | 3/2012 |
| JP | 2013-69765 A | 4/2013 |
| KR | 10-2012-0032305 A | 4/2012 |
| TW | 201210103 A1 | 3/2012 |
| TW | 201244183 A1 | 11/2012 |
| TW | M453969 U1 | 5/2013 |
| TW | 201322490 A1 | 6/2013 |
| WO | WO 2011/161608 A1 | 12/2011 |
| WO | 2012/026757 A2 | 3/2012 |
| WO | 2012/172901 A1 | 12/2012 |

OTHER PUBLICATIONS

Korean Office Action issued in corresponding Korean Patent Application No. 10-2014-0004205, mailed on Apr. 10, 2015; 7 pages in Korean language.

Wafer Level System Packaging and Integration for Solid State Lighting (SSL); Xuejun Fan; 13th International Conference on Thermal, Mechanical and Multi-Physics Simulation and Experiments in Microelectronics and Microsystems, EuroSimE 2012; 2012.

Self-adaptive phosphor coating technology for wafer-level scale chip packaging; Zhou Linsong, et al.; Journal of Semiconductors, vol. 34, No. 5; May 2013.

Office Action issued in corresponding Korean Patent Application No. 10-2014-0004205, mailed on Oct. 15, 2015.

Taiwanese Office Action dated Jan. 14, 2016 in Corresponding Taiwanese Patent Application No. 104100952.

* cited by examiner

SEMICONDUCTOR LIGHT EMITTING DEVICE

CROSS-REFERENCE TO RELATED APPLICATION

This application claims the benefit of Korean Patent Application No. 10-2014-0004205 filed on Jan. 13, 2014, with the Korean Intellectual Property Office, the disclosure of which is incorporated herein by reference.

BACKGROUND

The present disclosure relates to a semiconductor light emitting device.

A semiconductor light emitting diode (LED) is a semiconductor device converting electrical energy into optical energy, and includes a compound semiconductor material emitting light having a particular wavelength based on an energy band gap. Compared to a filament-based light source, a semiconductor LED has various advantages such as a long lifespan, low power consumption, excellent initial driving characteristics, and the like, and thus, demand for semiconductor LEDs has continued to grow. The uses of semiconductor LEDs have extended to devices, from backlight units (BLU) for Liquid Crystal Displays (LCD) to general illumination devices, within various technical fields.

Semiconductor LED chips include electrodes having different polarities (positive (+) and negative (−) polarities), and thus, a direction of a chip needs to be accurately determined during work. For example, in mounting a device, failures in accurately determining a direction of a chip may cause defective electrode connections.

SUMMARY

An aspect of the present disclosure may provide a semiconductor light emitting device capable of recognizing a direction of a semiconductor light emitting diode (LED) chip.

An aspect of the present disclosure is a light emitting device comprising a light emitting diode (LED) chip having a first main surface and a second main surface opposing the first main surface, and one or more side surfaces extending between the first main surface and second main surface. A plurality of electrodes is disposed on the first main surface. A wavelength conversion film is disposed on the second main surface. A mark is formed in the wavelength conversion film. The mark contains orientation information of the light emitting device, thereby enabling the light emitting device to be properly oriented on a receiving substrate.

In certain embodiments of the light emitting device, the mark may be a hole formed in the peripheral portion of the wavelength conversion film. The hole may be filled with a marking material. The marking material may be a reflective material. The marking material may be a different color than the wavelength conversion film.

In certain embodiments of the light emitting device, the mark may comprise a colored marking material.

In certain embodiments of the light emitting device, the mark may comprise an ink.

In certain embodiments of the light emitting device, the wavelength conversion film may comprise a phosphor film.

In certain embodiments, the light emitting device may further comprise a reflective structure surrounding the one or more sides of the LED chip. The reflective structure may have a first main surface and a second main surface opposing the first main surface, and the first main surface of the LED chip and the first main surface of the reflective structure are substantially coplanar. The reflective structure may have a first main surface and an opposing second main surface extending in a first direction, and one or more outer side surfaces extending between the reflective side layer first main surface and second main surface in a second direction substantially perpendicular to the first direction. The wavelength conversion film may have a first main surface and an opposing second main surface extending in the first direction, and one or more side surfaces extending between the phosphor film first main surface and second main surface in the second direction. The outer side surfaces of the reflective structure and the side surfaces of the wavelength conversion film may be substantially aligned in the second direction. The reflective structure may have a first main surface and an opposing second main surface extending in a first direction, and an opening extending between the first main surface and the second main surface in a second direction substantially perpendicular to the first direction, wherein the opening surrounds the LED chip.

In certain embodiments, the light emitting device may further comprise at least one additional mark formed in the peripheral portion of the wavelength conversion film.

In certain embodiments of the light emitting device, The mark may be located in a peripheral portion of the wavelength conversion film.

In another aspect of the present disclosure, a method of fabricating a light emitting device is provided comprising forming a wavelength conversion film and forming a plurality of marks in the wavelength conversion film. A plurality of LED chips is attached to the wavelength conversion film after forming the marks. Each LED chip has a first main surface and a second main surface opposing the first main surface. The first main surfaces of the LED chips are attached to the wavelength conversion film, the LED chips are spaced-apart from each other, and the LED chips are positioned on the wavelength conversion film relative to at least one of the marks. After attaching the LED chips, the wavelength conversion film is cured, and a singulation process is performed to form a plurality of individual LED devices.

In certain embodiments, the method of fabricating the light emitting device may further comprise depositing a reflective material between the spaced-apart LED chips to form a reflective structure surrounding each LED chip. Each chip may be positioned on the wavelength conversion film relative to a corresponding mark. The mark may comprise a colored marking material.

In certain embodiments, the method of fabricating the light emitting device may further comprise depositing a phosphor material between the spaced-apart LED chips to form a phosphor layer surrounding each LED chip.

In certain embodiments of the method of fabricating the light emitting device, the forming a plurality of marks in the wavelength conversion film may comprise forming a plurality of holes in the wavelength conversion film.

In certain embodiments, the method of fabricating the light emitting device may further comprise filling the plurality of holes with a marking material. The marking material may be a reflective material. The marking material may be optically distinguishable from the wavelength conversion film.

In certain embodiments of the method of fabricating the light emitting device, the mark may comprise an ink. The mark may be formed using a printing process. Each mark may be located in a peripheral portion of the individual light emitting device.

In certain embodiments of the method of fabricating the light emitting device, the wavelength conversion film may comprise a phosphor film.

In certain embodiments of the method of fabricating the light emitting device, the reflective structure may have a first main surface and a second main surface opposing the first main surface, and the first main surface of the LED chip and the first main surface of the reflective structure are substantially coplanar.

In certain embodiments of the method of fabricating the light emitting device, the reflective structure may have a first main surface and an opposing second main surface extending in a first direction, and one or more outer side surfaces extending between the reflective side layer first main surface and second main surface in a second direction substantially perpendicular to the first direction. The wavelength conversion film may have a first main surface and an opposing second main surface extending in the first direction, and one or more side surfaces extending between the phosphor film first main surface and second main in the second direction. The outer side surfaces of the reflective structure and the side surfaces of the wavelength conversion film may be substantially aligned in the second direction.

In another aspect of the present disclosure a light emitting device comprises a light emitting diode (LED) chip comprising a first conductivity-type nitride semiconductor base layer formed on a substrate, and a plurality of nano-light emitting structures spaced apart from each other formed on the nitride semiconductor base layer. Each nano-light emitting structure comprises a nanocore comprising the first conductivity-type nitride semiconductor. An active layer is disposed on the nanocore, and a second conductivity-type nitride semiconductor layer is disposed on the active layer. A mark is formed in a peripheral portion of the light emitting device.

In certain embodiments, the light emitting device may further comprise a contact electrode disposed on the second conductivity-type nitride semiconductor layers of the plurality of nano-light emitting structures. The light emitting device may further comprise a first electrode contacting the base layer and a second electrode contacting the contact electrode. The light emitting device may further comprise an insulating layer disposed on the contact electrode.

In certain embodiments of the light emitting device, the mark may be a hole formed in the peripheral portion of the light emitting device. The hole may be filled with a marking material. The marking material may be a reflective material.

In certain embodiments of the light emitting device, the mark may comprise a colored marking material.

In certain embodiments of the light emitting device, the mark may comprise an ink.

In certain embodiments, the light emitting device may further comprise a current blocking layer formed between the nanocore and the active layer. The current blocking layer may comprise an undoped nitride or a nitride doped with a conductivity-type impurity opposite to that of the nanocore.

In certain embodiments, the light emitting device may further comprise at least one additional mark formed in the peripheral portion of the light emitting device.

In certain embodiments of the light emitting device, the mark contains orientation information, thereby enabling the light emitting device to be properly oriented to a receiving substrate.

In certain embodiments, the light emitting device may further comprise a protective film overlying the LED chip. The mark may be formed in the protective film. The mark may be optically distinguishable from the protective film.

In another aspect of the present disclosure, a method of fabricating a light emitting device comprises forming a wavelength conversion film, and forming a plurality of marks in the wavelength conversion film. A plurality of LED chips is attached to the wavelength conversion film. Each LED chip has a first main surface and a second main surface opposing the first main surface. The first main surfaces of the LED chips are attached to the wavelength conversion film, and the LED chips are spaced-apart from each other. A singulation process is performed to form a plurality of individual LED devices.

In certain embodiments, the method of fabricating the light emitting device may further comprise depositing a reflective material between the spaced-apart LED chips to form a reflective structure surrounding each LED chip. The reflective structure may have a first main surface and a second main surface opposing the first main surface, and the first main surface of the LED chip and the first main surface of the reflective structure may be substantially coplanar. The reflective structure may have a first main surface and an opposing second main surface extending in a first direction, and one or more outer side surfaces extending between the reflective side layer first main surface and second main surface in a second direction substantially perpendicular to the first direction. The wavelength conversion film may have a first main surface and an opposing second main surface extending in the first direction, and one or more side surfaces extending between the phosphor film first main surface and second main in the second direction. The outer side surfaces of the reflective structure and the side surfaces of the wavelength conversion film may be substantially aligned in the second direction.

In certain embodiments, the method of fabricating the light emitting device may further comprise depositing a phosphor material between the spaced-apart LED chips to form a phosphor layer surrounding each LED chip.

In certain embodiments of the method of fabricating a light emitting device, the forming a plurality of marks in the wavelength conversion film may comprise forming a plurality of holes in the wavelength conversion film. The method may further comprise filling the plurality of holes with a marking material. The marking material may be a reflective material. The marking material may be optically distinguishable from the wavelength conversion film.

In certain embodiments of the method of fabricating the light emitting device, the mark may comprise a colored marking material.

In certain embodiments of the method of fabricating the light emitting device, the mark may comprise an ink. The mark may be formed using a printing process.

In certain embodiments of the method of fabricating the light emitting device, the wavelength conversion film may comprise a phosphor.

In certain embodiments of the method of fabricating the light emitting device, each mark may be located in a peripheral portion of the individual light emitting device.

In certain embodiments of the method of fabricating the light emitting device, each chip may be positioned on the wavelength conversion film relative to a corresponding mark.

In certain embodiments of the method of fabricating the light emitting device, the LED chips may be positioned on the wavelength conversion film relative to at least one of the marks.

In certain embodiments, the method of fabricating the light emitting device, may further comprise curing the wavelength conversion film.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
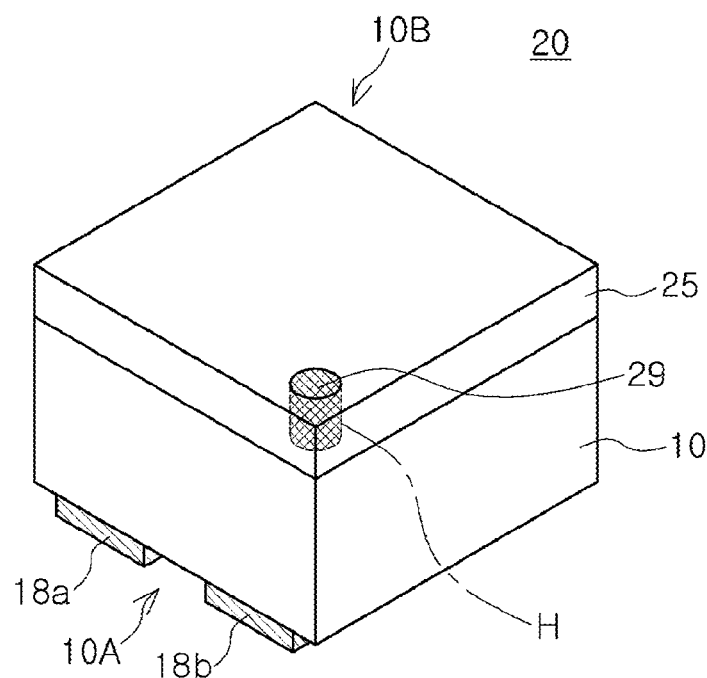
FIG. 1 is a perspective view schematically illustrating a semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Meanwhile, an expression "one example" used in the present disclosure does not refer to identical examples and is provided to stress different unique features between each of the examples. However, examples provided in the following description are not excluded from being associated with features of other examples and implemented thereafter. For example, even if matters described in a specific example are not described in a different example thereto, the matters may be understood as being related to the other example, unless otherwise mentioned in descriptions thereof.

FIG. 1 is a perspective view schematically illustrating a semiconductor light emitting device according to an exemplary embodiment of the present disclosure.

Referring to FIG. 1, a semiconductor light emitting device 20 according to the present exemplary embodiment includes a semiconductor light emitting diode (LED) chip 10 and a protective film 25.

The semiconductor LED chip 10 may have a first surface 10A on which first and second electrodes 18a and 18b are disposed and a second surface 10B opposing the first surface 10A. The semiconductor LED chip 10 may be a nitride semiconductor LED chip.

The protective film 25 may be positioned on the second surface 10B of the semiconductor LED chip 10. The protective film 25 may be an insulating layer such as a passivation layer. For example, the protective film may be formed of various materials such as a resin, glass, oxide, nitride, ceramic, and the like. The protective film 25 employed in the present exemplary embodiment is illustrated as an insulating layer such as a passivation layer, but it may also be a wavelength conversion film containing a wavelength conversion material such as a phosphor or a quantum dot. A semiconductor light emitting device emitting white light by using such a wavelength conversion layer may be provided. The semiconductor LED chip 10 may include an active layer emitting light having different wavelengths to output white light without using the phosphor. For example, in case of a semiconductor LED chip having nano-light emitting structures (please refer to FIG. 6), an active layer emitting light having different wavelengths, even in the case that the active layer is grown under the same growth conditions, may be obtained by varying sizes of nanocores and/or intervals therebetween, and white light may be implemented by using such an active layer.

Lateral surfaces of the protective film 25 may be substantially flat to be coplanar with those of the semiconductor LED chip 10. Being coplanar may be understood as having a surface on a common plane obtained through a cutting process. Unlike the present exemplary embodiment, the protective film 25 may be configured to extend to the lateral surfaces of the semiconductor LED chip 10.

The semiconductor light emitting device 20 may include a mark 29 provided in the protective film 25. The mark 29 may include information indicating a particular direction of the semiconductor LED chip 10. By using the information regarding a chip direction, polarities (positive (+) or negative (−)) of electrodes 18a and 18b disposed on the first surface 10A may be identified. Based on direction identification, the electrodes 18a and 18b of the semiconductor LED chip 10 may be accurately connected to electrodes of a mounting board.

The mark 29 may include directional information (for example, a symbol such as an arrow, a character, or the like) by itself, or may simply denote information regarding a chip direction by using a formation position thereof. For example, the mark 29 may be disposed asymmetrically with the center of the protective film 25 as a reference, and information regarding a chip direction may be indicated, based on such asymmetry.

In detail, as illustrated in FIG. 1, the mark 29 may be disposed in one corner of the protective film 25. It may be noted that the left corner side where the mark 29 is positioned is adjacent to the second electrode 18b. By using the asymmetrical arrangement of the mark 29, a chip direction (or electrode direction) may be easily recognized.

The mark 29 employed in the present exemplary embodiment may have a hole H penetrating a region of the protective film 25. The hole H may be filled with a filler material visually discernible from the protective film 25.

In an example, the filler material may be a material having a particular color. The particular color of the filler material may be easily discernible from that of the protective film 25. In another example, the filler material may be a resin containing reflective powder. The reflective powder may be metal powder or white ceramic powder having high reflectivity. For example, the reflective powder may be a material selected from the group consisting of $TiO_2$, $Al_2O_3$, $Nb_2O_5$, $Al_2O_3$ and ZnO, and in particular, may be white powder such as $TiO_2$ and $Al_2O_3$. The resin may be a transparent resin such as an epoxy resin or a silicon resin.

The mark 29 having directional information of the chip may be implemented to have various other shapes. For example, the mark 29 may be applied to a particular position of the surface of the protective film 25 through a printing process. Also, as mentioned above, the protective film 25 may be implemented as a wavelength conversion film containing a phosphor or a quantum dot capable of converting a wavelength of at least a partial amount of light generated by the LED chip into a different wavelength.

Figure 2:
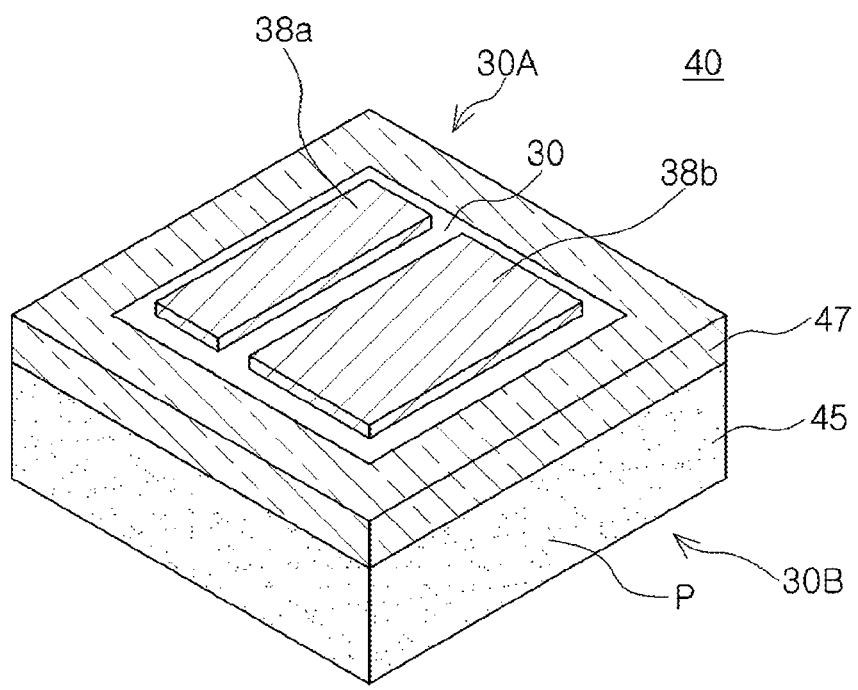
FIG. 2 is a perspective view schematically illustrating a semiconductor light emitting device according to an exemplary embodiment of the present disclosure.
Figure 3:
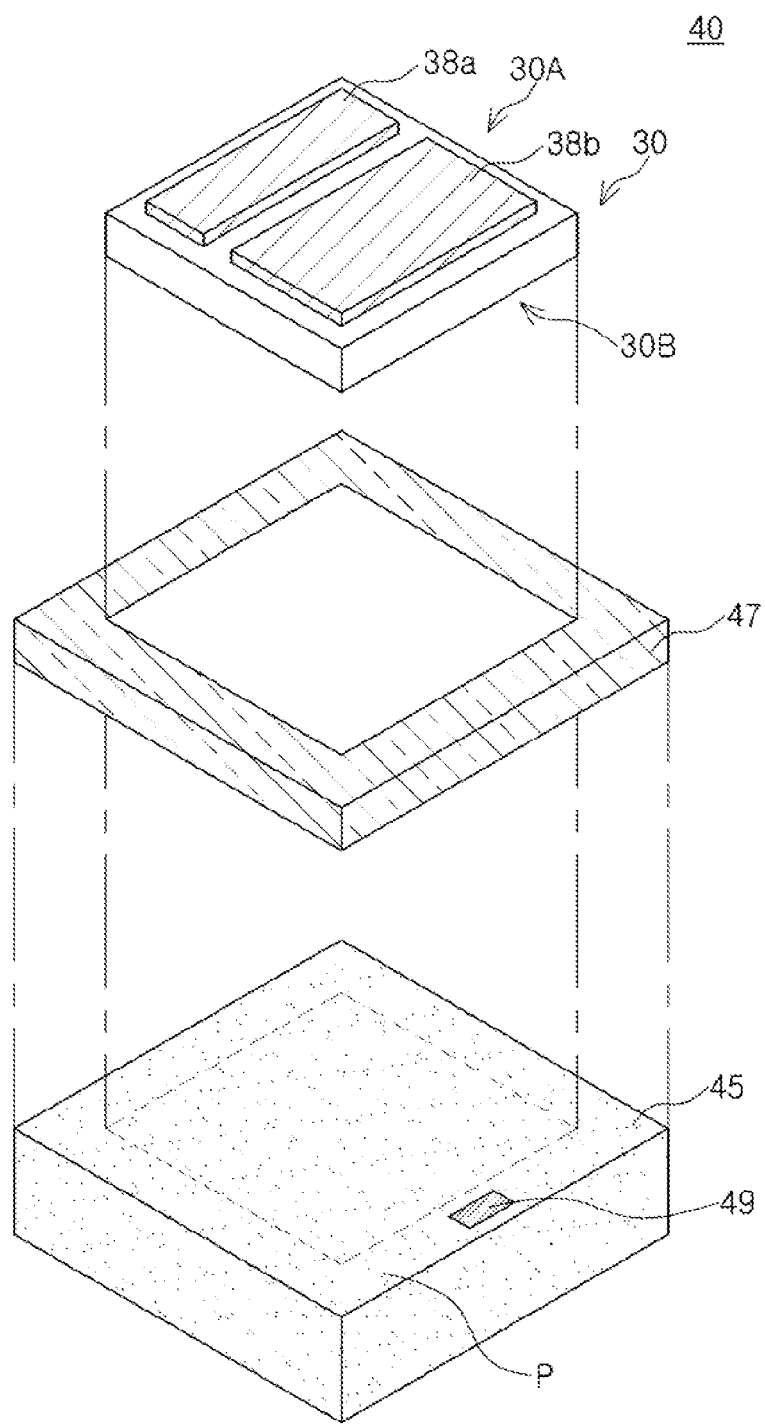
FIG. 3 is an exploded perspective view illustrating the semiconductor light emitting device of FIG. 2.

FIG. 2 is a perspective view schematically illustrating the semiconductor light emitting device according to an exemplary embodiment of the present disclosure, and FIG. 3 is an exploded perspective view illustrating the semiconductor light emitting device of FIG. 2.

Referring to FIG. 2, a semiconductor light emitting device 40 according to the present exemplary embodiment may include a semiconductor LED chip 30, a reflective structure 47, and a wavelength conversion film 45.

The semiconductor LED chip 30 may have a first surface 30A on which first and second electrodes 38a and 38b are disposed and a second surface 30B opposing the first surface 30A. The reflective structure 47 may be disposed to surround the semiconductor LED chip 30.

A wavelength conversion material P such as a phosphor or a quantum dot of a wavelength conversion film 45 may be excited by light emitted from the semiconductor LED chip 30 to convert wavelength of at least a partial amount of light into a different wavelength of light. The wavelength conversion material P may be two or more types of material providing light having different wavelengths. Light converted by the wavelength conversion film 45 and unconverted light may be mixed to output white light (please refer to FIG. 27 for a specific phosphor usage example).

In an example, light generated by the semiconductor LED chip 30 may be blue light, and the wavelength conversion material P may include at least one selected from the group consisting of a green phosphor, a yellow phosphor, an orange phosphor, and a red phosphor.

The wavelength conversion film 45 may be positioned on the second surface 30B of the semiconductor LED chip 30 to cover the reflective structure 47. The reflective structure 47 may be substantially flat to be coplanar with the second surface 30B of the semiconductor LED chip 30. Also, lateral surfaces of the wavelength conversion film 45 may be substantially flat to be coplanar with those of the reflective structure 47. Being coplanar may be understood as a surface obtained through a cutting process.

A mark 49 employed in the present exemplary embodiment may be formed by applying a discernible material to a region of a surface of the wavelength conversion film 45. The discernible material may be a material such as ink that may be visually discriminated from other regions of the wavelength conversion film 45. Such an application process may be performed by a printing process such as screen printing.

The mark 49 may be disposed at the center of one edge of the wavelength conversion film 45 to indicate a particular direction of the semiconductor LED chip 30. By using the information regarding a chip direction, polarities (positive (+) or negative (−)) of electrodes 38a and 38b disposed on the first surface 30A may be identified. In this manner, information regarding a chip direction may be indicated through an asymmetrical arrangement of the mark 49, similarly to the former exemplary embodiment.

The mark 49 may be positioned in a region of the wavelength conversion film 45 corresponding to the reflective structure 47. As illustrated in FIG. 3, the mark 49 may be applied to a surface of the wavelength conversion film 45 in contact with the semiconductor LED chip 30. In the present exemplary embodiment, since the mark 49 is positioned in a region corresponding to the reflective structure 47, the mark 49 may be in contact with the reflective structure 47. As a result, the mark 49 may be excluded from a light path, not interfering with light generated by the semiconductor LED chip 30.

The wavelength conversion film 45 may be formed of a resin layer, a glass layer, or a ceramic layer containing a wavelength conversion material P such as a phosphor or a quantum dot. Thus, the wavelength conversion film 45 may be transparent or translucent. For example, in a case in which the wavelength conversion film 45 is formed of a resin layer containing a yellow phosphor, the wavelength conversion film 45 may be provided as a translucent yellow layer. Thus, although the mark 49 is positioned in the surface of the wavelength conversion film 45 in contact with the reflective structure 47, the mark 49 may be readily recognized in the opposite surface of the wavelength conversion film 45. Also, unlike the present exemplary embodiment, even in a light emitting device employing a protective film not containing a wavelength conversion material, rather than employing the wavelength conversion film 45, information regarding a direction of a chip may be provided by printing the mark 49 on the protective film, similar to the present exemplary embodiment.

Figure 4:
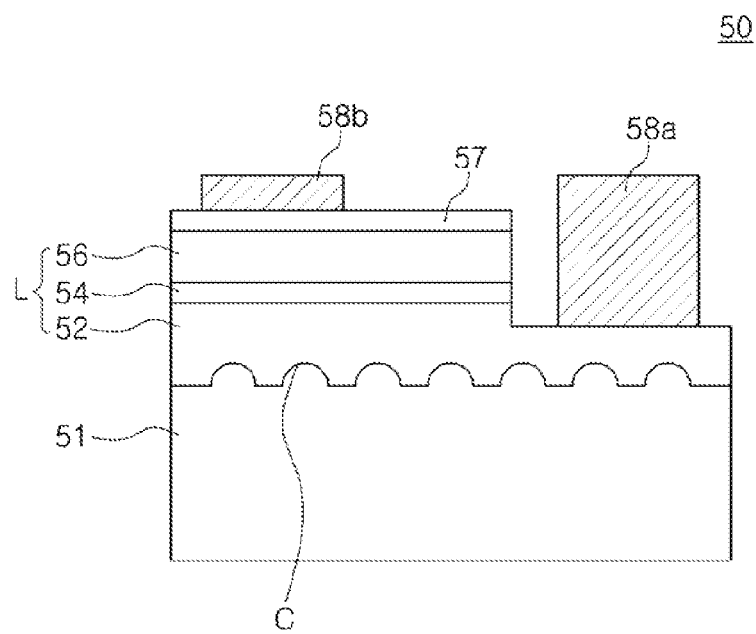
FIGS. 4 through 6 are cross-sectional views illustrating various semiconductor light emitting diode chips employable in an exemplary embodiment of the present disclosure.
Figure 5:
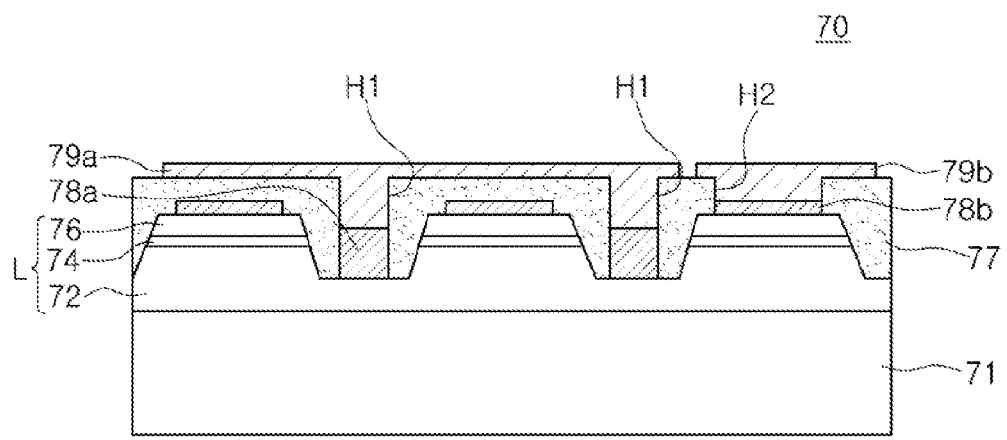
Figure 6:
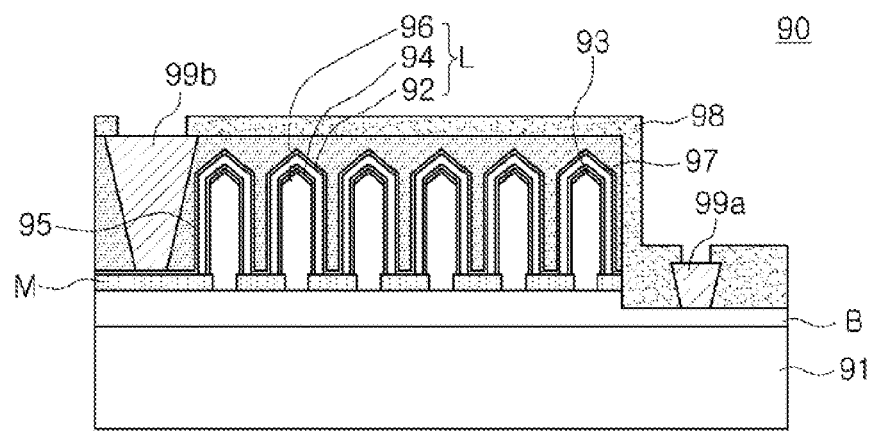

In the present exemplary embodiment, various types of semiconductor LED chips may be employed. FIGS. 4 through 6 are cross-sectional views illustrating various semiconductor LED chips employable in an exemplary embodiment of the present disclosure.

A semiconductor LED chip 50 illustrated in FIG. 4 includes a substrate 51 and a semiconductor laminate L formed on the substrate 51. The semiconductor laminate L may include first and second conductivity-type semiconductor layers 52 and 56 and an active layer 54 positioned therebetween.

The substrate 51 may be an insulating, conductive, or semiconductor substrate. A growth surface of the substrate 51 may have a protrusion and depression pattern C to grow a high quality crystal, as well as improve light extraction efficiency. For example, the substrate 51 may be formed of sapphire, SiC, Si, $MgAl_2O_4$, MgO, $LiAlO_2$, $LiGaO_2$, or GaN.

The first conductivity-type semiconductor 52 may be a nitride semiconductor satisfying n-type $Al_xIn_yGa_{1-x-y}N$ ($0 \le x<1$, $0 \le y<1$, $0 \le x+y<1$), and here, an n-type impurity may be silicon (Si). For example, the first conductivity-type nitride semiconductor layer 52 may be n-type GaN. The active layer 54 may have a multi quantum well (MQW) structure in which quantum well layers and quantum barrier layers are alternately stacked. For example, in case of a nitride semiconductor, a GaN/InGaN structure may be used. Alternatively, the active layer 54 may have a single quantum well (SQW) structure. The second conductivity-type nitride semiconductor layer 56 may be a nitride semiconductor layer satisfying p-type $Al_xIn_yGa_{1-x-y}N$ ($0 \le x<1$, $0 \le y<1$, $0 \le x+y<1$), and here, a p-type impurity may be magnesium (Mg). For example, the second conductivity-type nitride semiconductor layer 56 may be p-type AlGaN/GaN.

In the semiconductor laminate L employed in the present exemplary embodiment, regions of the second conductivity-type nitride semiconductor layer 56 and the active layer 54 may be removed through mesa etching, allowing the first conductivity-type nitride semiconductor layer 52 to have a partially exposed region.

A first electrode 58a may be disposed in the exposed region of the first conductivity-type nitride semiconductor layer 62, and an ohmic-contact layer 57 and a second electrode 58b may be sequentially disposed on the second conductivity-type nitride semiconductor layer 56. For example, the ohmic-contact layer 57 may include at least one of materials such as ITO, ZnO, a graphene layer, Ag, Ni, Al, Rh, Pd, Ir, Ru, Mg, Zn, Pt, Au, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, and the like. The first and second electrodes 58a and 58b may include materials such as Ag, Ni, Al, Rh, Pd, Ir, Ru, Mg, Zn, Pt, Au, and the like, and may be a single layer or have a structure including two or more layers, but the present disclosure is not limited thereto. A reflective electrode structure may be employed to implement a flipchip structure, as needed. For example, the first electrode 58a may have a structure including Al/Ti/Pt/Ti layers (for example, Al/Ti/Pt/Ti/Cr/Au/Sn solder, Al/Ti/Pt/Ti/Pt/Ti/Pt/Ti/Ni/Pt/Au/Sn solder, or Al/Ti/Pt/Ti/Pt/Ti/Pt/Ti/Au/Ti/AuSn) or a structure including Cr/Au layers (for example, Cr/Au/Pt/Ti/Ti/TiN/Ti/Ni/Au). The second electrode 58b may have a structure including an Ag layer (for example, Ag/Ti/Pt/Ti/TiN/Ti/TiN/Cr/Au/Ti/Au).

A semiconductor LED chip 70 illustrated in FIG. 5 includes a substrate 71 and a semiconductor laminate L disposed on the substrate 71. The semiconductor laminate L may include a first conductivity-type semiconductor layer 72, an active layer 74, and a second conductivity-type semiconductor layer 76.

The semiconductor LED chip 70 includes first and second contact electrodes 78a and 78b respectively connected to the first and second conductivity-type semiconductor layers 72 and 76. The semiconductor LED chip 70 includes an insulating layer 77 covering the semiconductor laminate L. The insulating layer 77 may have first and second openings H1 and H2 respectively exposing partial regions of the first and second contact electrodes 78a and 78b.

The semiconductor LED chip 70 may include first and second electrode pads 79a and 79b respectively connected to the first and second contact electrodes 78a and 78b through the first and second openings H1 and H2. The first and second electrode pads 79a and 79b may include Au, Sn, Au/Sn.

A semiconductor LED chip 90 illustrated in FIG. 6 includes a substrate 91, a base layer B disposed on the substrate 91, and a plurality of nano-light emitting structures L disposed on the base layer B.

The substrate 91 may be an insulating, conductive, or semiconductor substrate. For example, the substrate 91 may be formed of sapphire, SiC, Si, $MgAl_2O_4$, MgO, $LiAlO_2$, $LiGaO_2$, or GaN. The base layer B may be a nitride semiconductor satisfying $Al_xIn_yGa_{1-x-y}N$ ($0 \le x<1$, $0 \le y<1$, $0 \le x+y<1$) and may be doped with an n-type impurity such as silicon (Si) to have a particular conductivity type.

An insulating layer M may be formed on the base layer B having openings allowing nano-light emitting structures L (in particular, nanocores) to grow therein. The base layer B is exposed through the openings, and nanocores 92 may be formed in the exposed regions. The insulating layer m may be used as a mask for growing the nanocores 92. The insulating layer M may be formed of an insulating material such as $SiO_2$ or $SiN_x$ that may be used in a semiconductor process.

The nano-light emitting structures L may include the nanocore 92 formed of a first conductivity-type semiconductor and an active layer 94 and a second conductivity-type semiconductor layer 96 sequentially formed on a surface of the nanocore 92.

The nanocore 92 may be a nitride semiconductor layer satisfying n-type $Al_xIn_yGa_{1-x-y}N$ ($0 \le x<1$, $0 \le y<1$, $0 \le x+y<1$) similar to that of the base layer B. For example the nanocore 92 may be formed of n-type GaN. The active layer 94 may have a multi quantum well (MQW) structure in which quantum well layers and quantum barrier layers are alternately stacked. For example, in case of a nitride semiconductor, a GaN/InGaN structure may be used. The active layer 94 may also have a single quantum well (SQW) structure. The second conductivity-type nitride semiconductor layer 96 may be a crystal satisfying p-type $Al_xIn_yGa_{1-x-y}N$ ($0 \le x<1$, $0 \le y<1$, $0 \le x+y<1$).

The nano-structure semiconductor light emitting device 90 may include a contact electrode 96 in ohmic-contact with the second conductivity-type nitride semiconductor layer 96. The contact electrode 95 employed in the present exemplary embodiment may be formed of a transparent electrode material to emit light toward the nano-light emitting structures (in the direction opposite to the substrate side direction). For example, the contact electrode 95 may be formed of a transparent electrode material such as indium tin oxide (ITO), and formed of graphene, as needed.

The contact electrode 95 may include materials such as Ag, Ni, Al, Rh, Pd, Ir, Ru, Mg, Zn, Pt, Au, or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like, but the present disclosure is not limited thereto. The nano-structure semiconductor light emitting device 90 may employ a reflective electrode structure so as to be implemented to have a flipchip structure, as needed.

An insulating filling part 97 may be formed in a space between the nano-light emitting structures L. The insulating filling part 97 may be formed of an insulating material such as $SiO_2$ or $SiN_X$. In detail, the insulating filling part 97 may be formed of tetraethylorthosilane (TEOS), borophosphor silicate glass (BPSG), CVD-$SiO_2$, spin-on glass (SOG), or a spin-on dielectric (SOD) material in order to easily fill the space between the nano-light emitting structures L. In a configuration different from the present exemplary embodiment, an electrode element related to the contact electrode 95 may fill the entirety or a portion of the space between the nano-light emitting structures L.

The nano-structure semiconductor light emitting device 90 may include first and second electrodes 99a and 99b. The first electrode 99a may be disposed in a partially exposed region of the base layer 92 formed of the first conductivity-type semiconductor. Also, the second electrode 99b may be disposed in an exposed portion of an extended region of the contact electrode 95.

The nano-structure semiconductor light emitting device 90 may further include a passivation layer 98. The passivation layer 98 may be used to protect the nano-light emitting structure together with the insulating filler part 98. The passivation layer 98 may serve to firmly maintain the first and second electrodes 99a and 99b, as well as cover the exposed semiconductor region to protect it. The passivation layer 98 may be formed of a material identical or similar to that of the insulating filling part 97.

In this example, unlike a crystal face (for example, M face) of a lateral surface of the nanocore 92, a tip portion of the nanocore 92 may have a sloped crystal face (for example, r face). A current blocking intermediate layer 93 may be formed the tip portion of the nanocore 92. The current blocking intermediate layer 93 may be positioned between the active layer 94 and the nanocore 92. The current blocking intermediate layer 93 may be formed of a material having high electrical resistance to block a leakage current that may be caused in the tip portion of the nanocore 92. For example, the current blocking intermediate layer 93 may be a semiconductor layer not doped on purpose or may be a semiconductor layer doped with a second conductivity-type impurity opposite to that of the nanocore 92. For example, in a case in which the nanocore 92 is n-type GaN, the current blocking intermediate layer 93 may be undoped GaN or GaN doped with a p-type impurity such as magnesium (Mg). The current blocking intermediate layer 93 may be a high resistance region formed of the same material (for example GaN) but implemented with various doping concentrations or doping materials, without being particularly discernible from an adjacent layer. For example, GaN may be grown, while supplying an n-type impurity, to form the nanocore 92 and GaN may continue to be grown, while preventing supply of the n-type impurity or supplying a p-type impurity such as magnesium (Mg), to form the desired current blocking intermediate layer 93. Also, while GaN, nanocore 92, is being grown, a source of aluminum (Al) and/or indium (In) may be additionally supplied to form the current blocking intermediate layer 93 formed of a different composition $Al_xIn_yGa_{1-x-y}N$ ($0 \leq x < 1$, $0 \leq y < 1$, $0 \leq x+y < 1$).

FIGS. 7 through 15 are views illustrating major processes of a method of manufacturing a semiconductor light emitting device according to an exemplary embodiment of the present disclosure.

Figure 7:
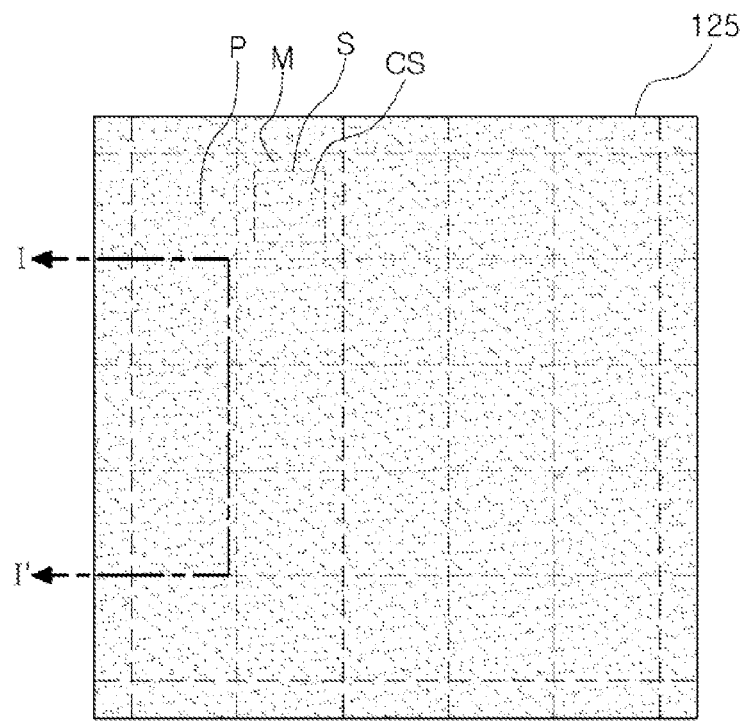
FIGS. 7 through 15B are views illustrating major processes of a method of manufacturing a semiconductor light emitting device according to an exemplary embodiment of the present disclosure.
Figure 8:
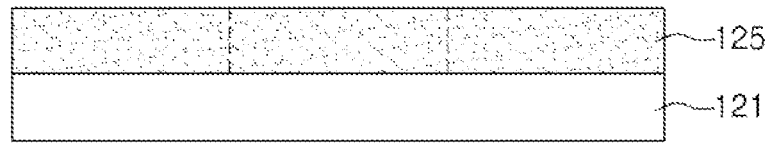

As illustrated in FIGS. 7 and 8, a wavelength conversion film 125 having a plurality of regions S may be prepared. FIG. 8 may be understood as a cross-sectional view of the wavelength conversion film 125 illustrated in FIG. 7 taken along line I-I'.

The wavelength conversion film 125 may be a resin containing a wavelength conversion material such as a phosphor or a ceramic film containing a wavelength conversion material such as a phosphor. In a specific example, the wavelength conversion film 125 may be glass or an oxide film containing a wavelength conversion material. In the present exemplary embodiment, the wavelength conversion film 125 is illustrated as a protective film, but in another exemplary embodiment, a different protective film not using the wavelength conversion film 125 may be used. For example, a resin, glass, an oxide film, or ceramic not containing a wavelength conversion material or containing a different functional material.

The plurality of regions S refer to regions for individual light emitting devices and may have an area greater than or equal to that of a semiconductor LED chip to be applied thereto. In the present exemplary embodiment, each region S may have a sufficient area having a predetermined marginal region M surrounding a region CS in which a chip is to be disposed. A width of the marginal region M may be set a size of a structure (for example, a reflective structure) to be additionally formed and/or a line width in a cutting process, or the like.

For the description purposes, the wavelength conversion film 125 is illustrated as having a 5×5 arrangement of regions (S), but the present disclosure is not limited thereto. As illustrated In FIG. 8, the wavelength conversion film 125 may be disposed on a support 121 such as a PET film to provide work efficiency.

Figure 9:
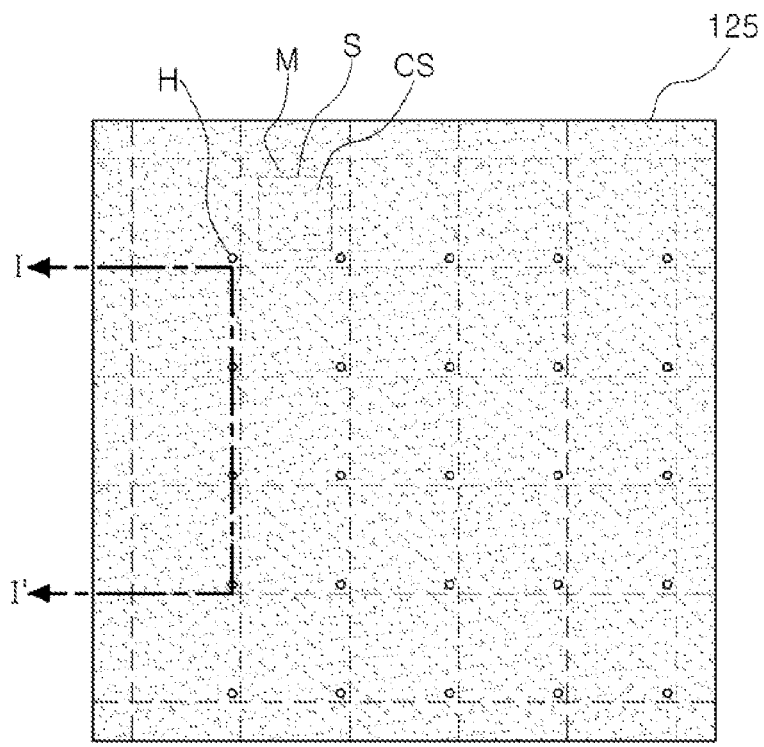
Figure 10:
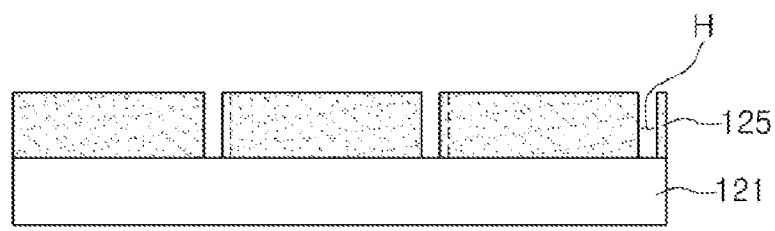

As illustrated in FIGS. 9 and 10, holes H may be formed in each of the regions S of the wavelength conversion film 125. FIG. 10 may be understood as a cross-sectional view of the wavelength conversion film 125 taken along line I-I'.

The holes H may be used to provide a mark during a follow-up process (for example, filling process). However, holes H may also be discernible by themselves, so the holes H may be used as marks without performing any additional process. The holes H may be formed through various processes such as a punching process or laser machining.

The holes H may be disposed as close as possible to an outer edge of each region S in the marginal region M so as not be positioned in a light movement path. As illustrated in FIG. 9, the holes may be positioned to be adjacent to the corner of each region S. The holes H may be positioned in the marginal region M in which a structure (for example, a reflective structure), rather than in the region CS in which the semiconductor LED chip 110 is disposed. The holes H may be disposed in regular positions of respective regions S or may be disposed in regularly changed positions. Such a layout may allow chips to be aligned by using the holes (please refer to FIG. 11).

In the present exemplary embodiment, a scheme of forming holes H is illustrated as a mark formation process, but a scheme of partially applying a discernible material such as ink by using a printing process may also be implemented in this process (please refer to FIGS. 2 and 3).

Figure 11:
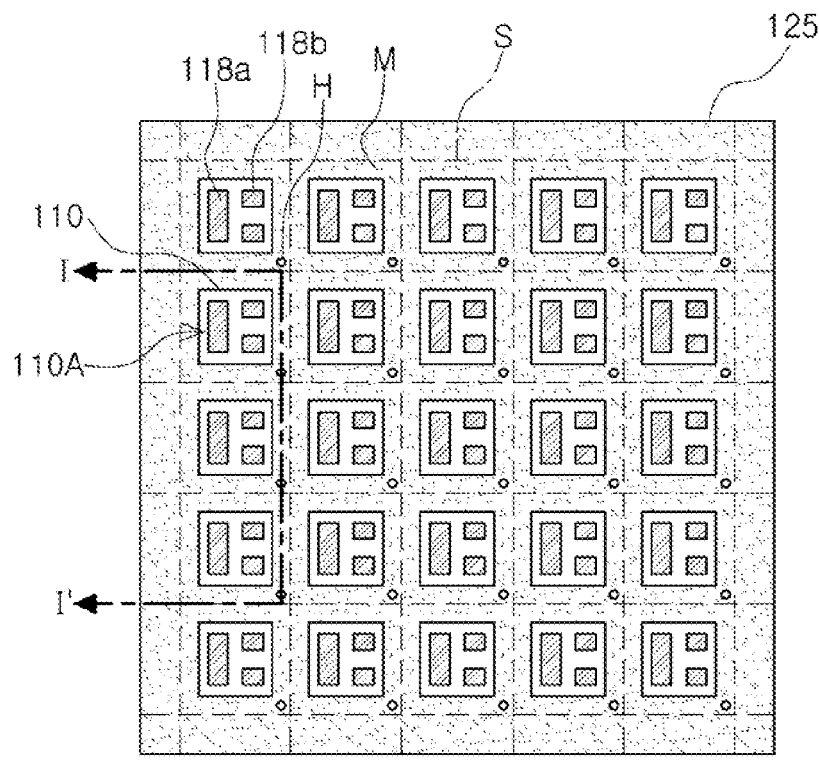
Figure 12:
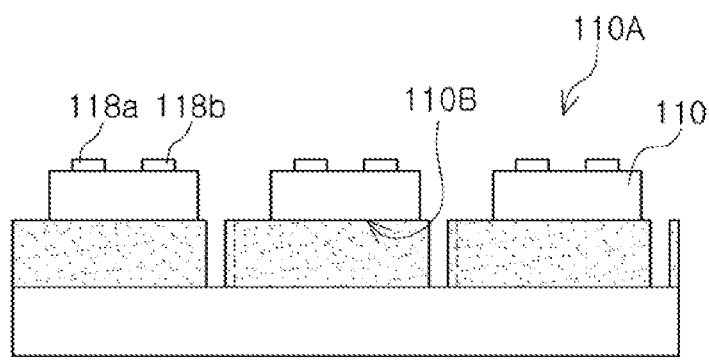

As illustrated in FIGS. 11 and 12, semiconductor LED chips 110 may be disposed in respective regions. FIG. 11 may be understood as a cross-sectional view of the wavelength conversion film 125 illustrated in FIG. 8 taken along line I-I'.

The semiconductor LED chips 110 may be disposed in respective regions S such that a first surface 110A in which first and second electrodes 118a and 118b are formed face upwards. A second surface 110B of each of the semiconductor LED chips 110 may be in contact with the wavelength conversion film 125. As described above, during this layout process, the semiconductor LED chips 110 may be accurately aligned by using the holes formed in advance. In the case in which the holes are regularly positioned in respective regions as in the present exemplary embodiment, the semiconductor LED chips 110 may be aligned based on the holes H, facilitating a desired accurate aligning process.

Also, as well as in the present exemplary embodiment, a chip aligning process using a mark may also be performed in an example of directly printing a mark. Meanwhile, in order to easily align positions of the chips 110, marks (or holes) corresponding to particular portions of outer edges may be formed. For example, marks may be disposed in corners in an "L" shape to be used as an indicator designating corner positions of the chips 110.

Figure 13:
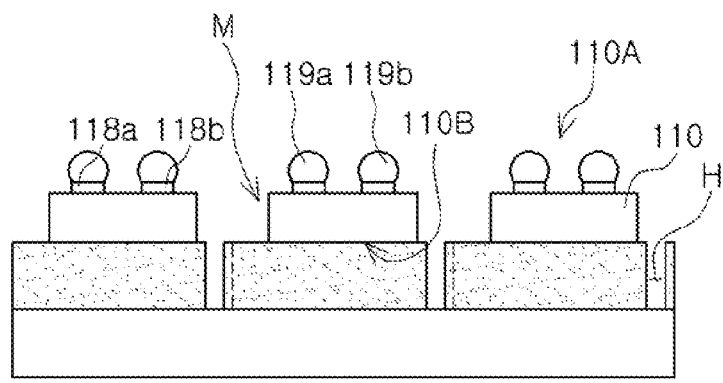

Subsequently, as illustrated in FIG. 13, bumps 119a and 119b having a predetermined height may be formed on the first and second electrodes 118a and 118b.

This process may be understood as an option that may be employed for a particular need. For example, this process may be advantageously used in a case of forming the reflective structure (127 in FIG. 14) to be formed in a follow-up process such that it extends to the first surface 110A of the chip 110, rather than being limited to the lateral surface of the semiconductor LED chip 110. The bumps 119a and 119b may include a eutectic metal such as gold (Au), tin (Sn), or Au/Sn. The bumps 119a and 119b may have a height greater than at least a desired thickness of a reflective structure to be positioned on the first surface 110a of the chip 110.

Figure 14A:
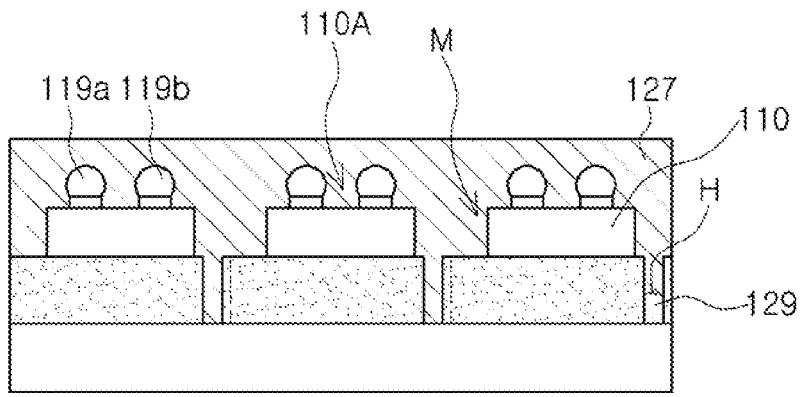

Thereafter, as illustrated in FIG. 14A, the reflective structure 127 may be formed in the spaces between the semiconductor LED chips 110, namely, in the marginal regions M.

This process may include applying a liquid resin containing reflective powder to the marginal regions M to surround the semiconductor LED chips and curing the applied liquid resin. In particular, during operation of applying the liquid resin containing the reflective powder in this process, the holes H may be filled with the liquid resin containing the reflective powder, and marks 129 formed of the holes filled with the discernible material may be completed through the curing process.

In the present exemplary embodiment, as illustrated in FIG. 14A, the reflective structure 127 may be formed to cover even the first surface 110A with the electrodes 118a and 118b formed thereon, as well as surrounding the lateral surfaces of the chips 110. Through this configuration, when mounted with the first surface 110A facing downwards, light may be more effectively extracted in a desired upward direction by the reflective structure 127 region positioned on the first surface 110A.

As described above, the reflective powder may be metal powder or white ceramic powder having high reflectivity. For example, the reflective powder may be a material selected from among $TiO_2$, $Al_2O_3$, $Nb_2O_5$, $Al_2O_3$, and ZnO, and in particular, may be white powder such as $TiO_2$ or $Al_2O_3$. The resin may be a transparent resin such as an epoxy resin or a silicon resin.

Figure 14B:
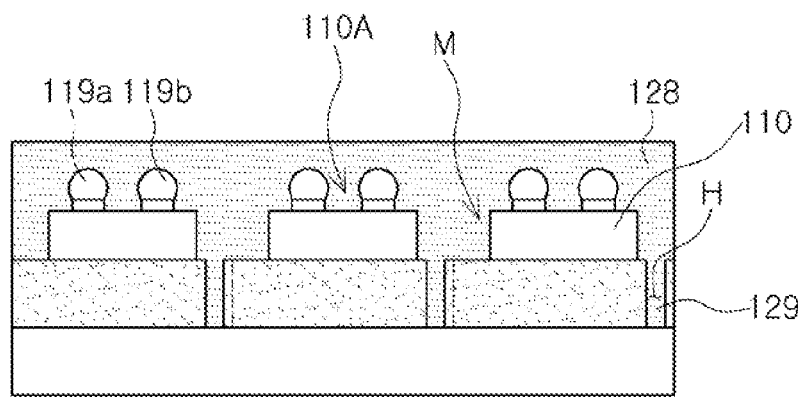

In an alternate embodiment, a phosphor layer 128 may be deposited between the spaced-apart LED chips 110 to form a phosphor layer surrounding each chip, as shown in FIG. 14B, instead of the reflective structure 127. The phosphor layer may be formed to cover even the first surface 110A with the electrodes 118a and 118b formed thereon, as well as surrounding the lateral surfaces of the chips 110.

Figure 15A:
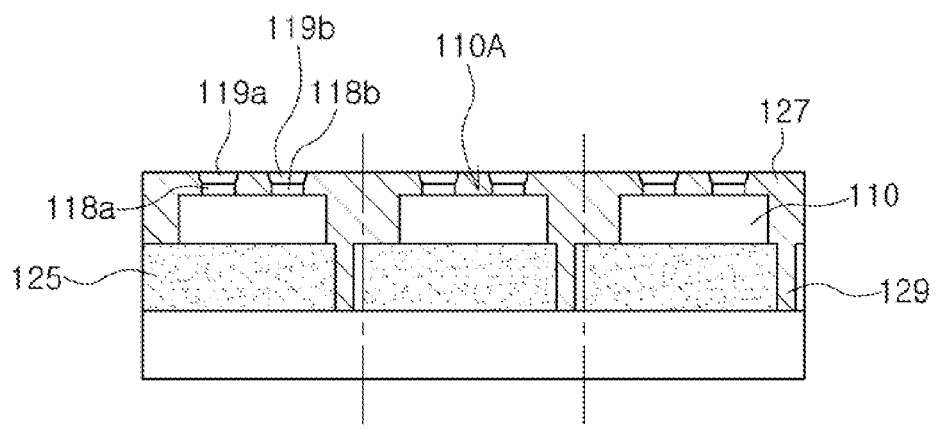
Figure 15B:
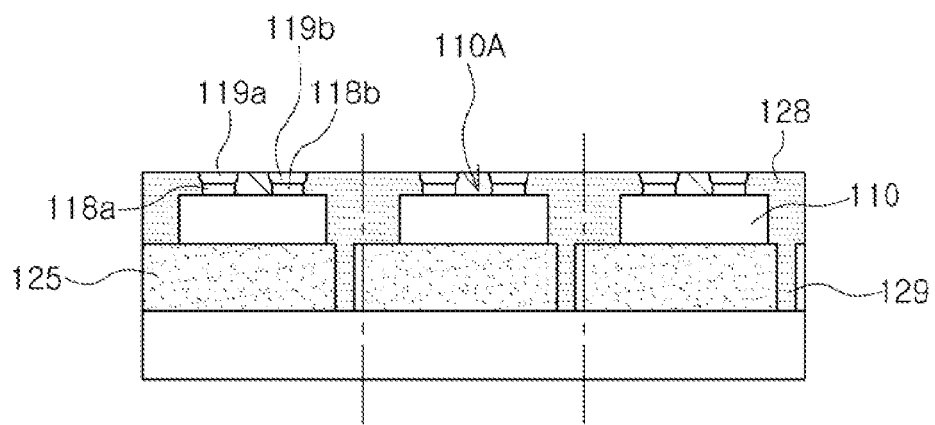
Figure 16A:
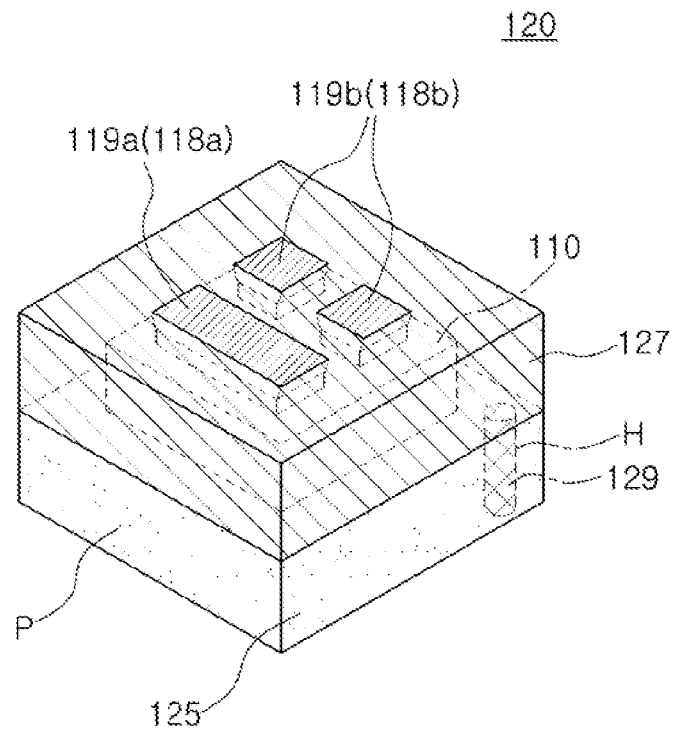
FIGS. 16A, 16B, 17A, and 17B are top and bottom plan views of the semiconductor light emitting device obtained in FIGS. 15A and 15B.
Figure 17A:
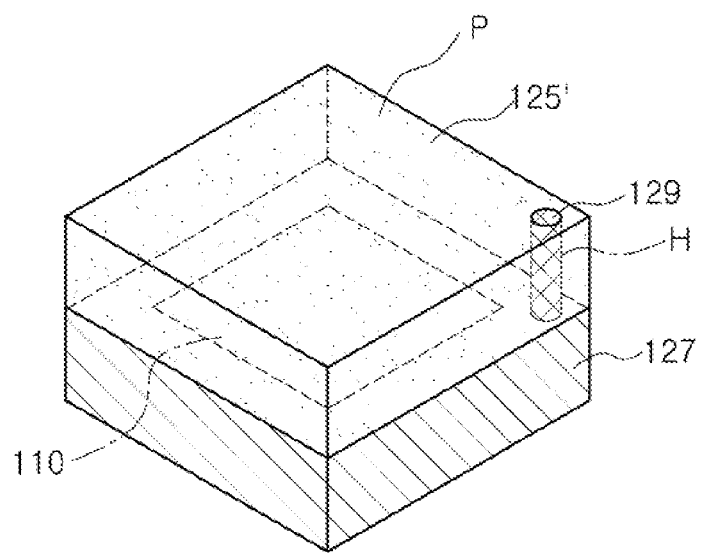
Figure 16B:
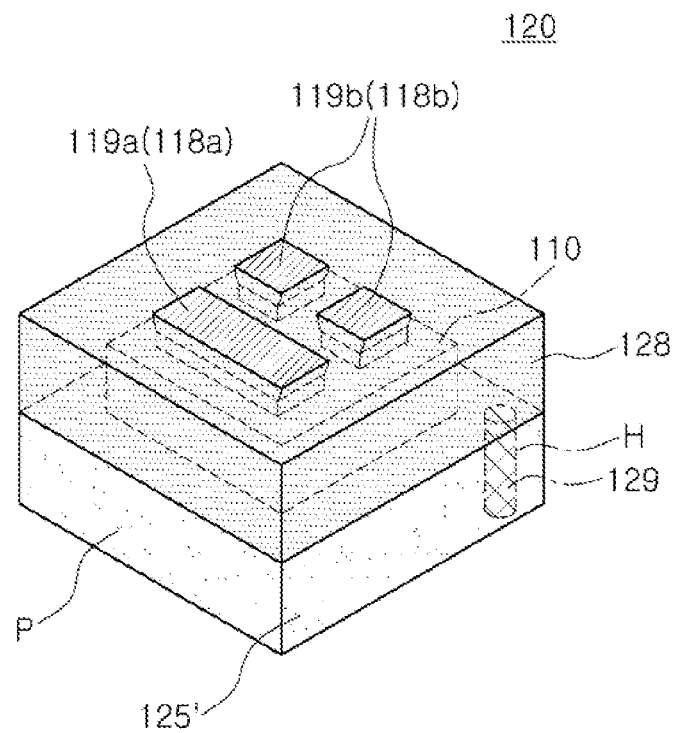
Figure 17B:
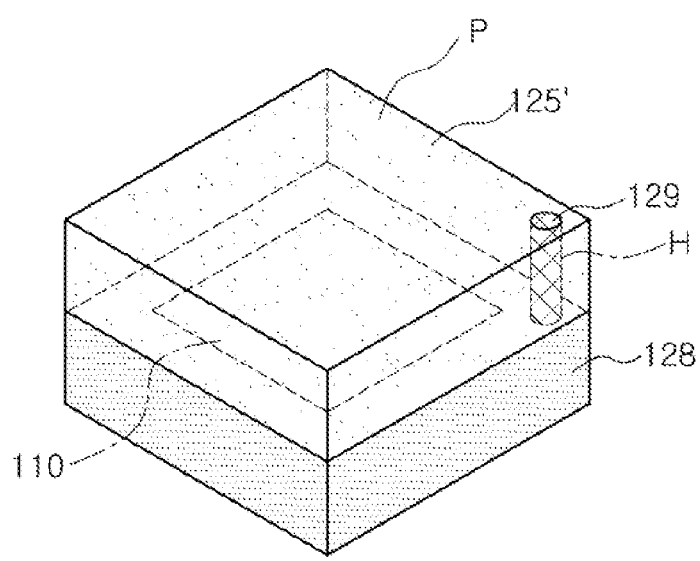

Thereafter, as illustrated in FIGS. 15A and 15B, the reflective structure 127 region and the phosphor layer 128 formed on the first surface of the semiconductor LED chips 110 may be ground to expose the bumps 119a and 119b.

Through this process, a desired thickness of the reflective structure 127 and the phosphor layer 128 may be relatively accurately controlled, and the exposure of the bumps 119a and 119b guarantees a follow-up electrical connection process. Subsequently, a cutting process may be performed along the line indicated by the dotted lines to obtain individual semiconductor light emitting device. FIGS. 16A, 16B, 17A, and 17D illustrate a semiconductor light emitting devices 120 obtained thusly.

Referring to FIGS. 16A, 16B, 17A, and 17B, the semiconductor light emitting devices 120 obtained from the aforementioned process are illustrated.

The semiconductor light emitting devices 120 include the semiconductor LED chip 110 and the reflective structure 127 or phosphor layer 128 surrounding the lateral surfaces of the semiconductor LED chip 110. Bumps 119a and 119b related to the first and second electrodes 118a and 118b are positioned on the first surface 110A of the semiconductor LED chip 110, and here, the bumps 119a and 119b may have an upper surface substantially flat with the surface of the reflective structure 127 or phosphor layer 128.

A wavelength conversion film 125' may be positioned on the second surface of the semiconductor LED chip 110 to cover the reflective structure 127 or phosphor layer 128. The lateral surfaces of the reflective structure 127 and phosphor layer 128 are obtained through the cutting process as described above with reference to FIGS. 15A and 15B, and thus, lateral surfaces of the wavelength conversion film 125' may be substantially coplanar with the lateral surfaces of the reflective structure 127 or phosphor layer 128.

The mark 129 employed in the present exemplary embodiment may include a hole filled with a material identical to that of the reflective structure. The mark 129 may be disposed in one corner to indicate a particular direction of the semiconductor LED chip 110. By using the information regarding a chip direction, polarities (positive (+) or negative (−)) of the electrodes 118a and 118b disposed on the first surface 110A may be identified. In this manner, similar to those of the former exemplary embodiments, information regarding a chip direction may be obtained through the asymmetrical arrangement of the mark 129.

Like the chip employed in the present exemplary embodiment, a plurality of first electrodes or a plurality of second electrodes may be provided. Alternatively, a plurality of first electrodes and a plurality of second electrodes may be provided. Thus, in order to appropriately express additionally required information, a plurality of marks may be employed. For example, a plurality of marks may be disposed at positions corresponding to respective electrodes to indicate the number of the electrodes together with positions of the electrodes.

In the present exemplary embodiment, the configuration of providing a marginal region is illustrated, but a chip may be implemented such that lateral surfaces thereof are exposed without a marginal region. Also, without employing a reflective structure, an additional wavelength conversion film or passivation layer may be provided.

In the aforementioned exemplary embodiments, the electrodes of the semiconductor LED chip are directly connected to an external circuit, but a package type semiconductor light emitting device employing a substrate having a separate electrode structure (for example, a package substrate) may also be implemented. Such a semiconductor light emitting device is illustrated in FIGS. 18 and 19.

Figure 18:
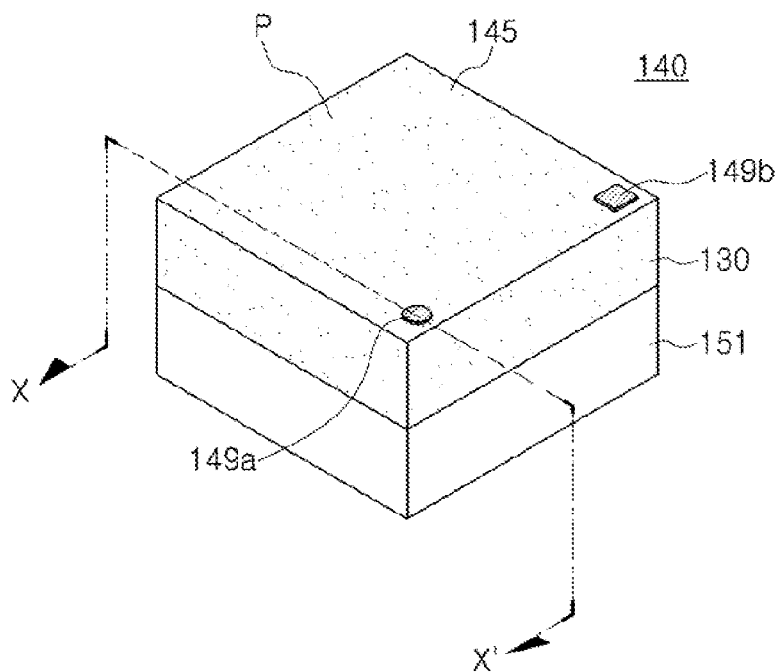
FIG. 18 is a perspective view schematically illustrating a semiconductor light emitting device according to an exemplary embodiment of the present disclosure.
Figure 19:
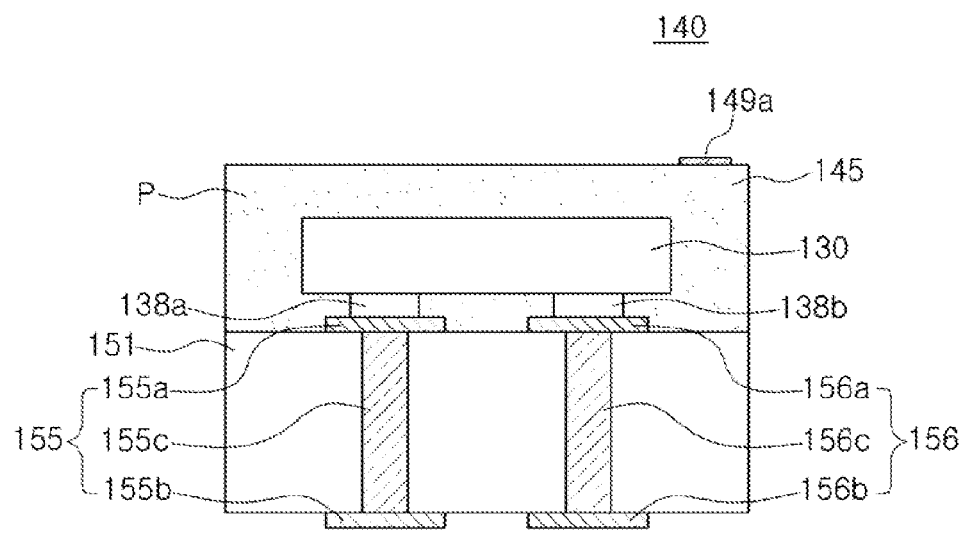
FIG. 19 is a cross-sectional view illustrating the semiconductor light emitting device of FIG. 18 taken along line X-X'.

FIG. 18 is a perspective view schematically illustrating a semiconductor light emitting device according to an exemplary embodiment of the present disclosure, and FIG. 19 is a cross-sectional view illustrating the semiconductor light emitting device of FIG. 18 taken along line X-X'.

Referring to FIGS. 18 and 19, a semiconductor light emitting device 140 according to the present exemplary embodiment includes a circuit board 151 and a semiconductor LED chip 130 mounted on the circuit board 151.

The circuit board 151 has first and second electrode structures 155 and 156. The first and second electrode structures 155 and 156 include first and second upper electrodes 155a and 156a disposed on an upper surface of the circuit board 151, first and second lower electrodes 155b and 156b disposed on a lower surface of the circuit board 151, and first and second through electrodes 155c and 156c connecting the first and second upper electrodes 155a and 156a and the first and second lower electrodes 155b and 156b, respectively. The circuit board 151 employed in the present disclosure is merely illustrative and may be applied in various forms. For example, the circuit board 151 may be provided as a printed circuit board (PCB) such as a metal-core PCB (MCPCB), a metal PCB (MPCB), or a flexible PCB (FPCB), as a ceramic board formed of AlN, $Al_2O_3$, or the like, or as a board with a lead frame fixed thereon.

The semiconductor LED chip 130 may be mounted on the circuit board 151 in a flipchip bonding manner. Namely, the semiconductor LED chip 130 may be mounted on the circuit board 151 such that first and second electrodes 138a and 138b face the circuit board 151. The first and second electrodes 138a and 138b may be bonded to the first and second upper electrodes 155a and 156a by using a bonding layer, for example, a eutectic metal layer.

The semiconductor light emitting device 140 may include a wavelength conversion film 145 disposed to cover the semiconductor LED chip 130. The wavelength conversion film 145 may include a wavelength conversion material P such as a phosphor.

The semiconductor light emitting device 1400 may include two marks 149a and 149b formed of a discernible material and positioned in regions of a surface of the wavelength conversion film 145. Each of the marks 149a and 149b may have different shapes and be formed at different positions. The discernible material may be a material, such as ink, visually discriminated from other regions of the wavelength conversion film 145. The marks 149a and 149b may be formed through a printing process such as screen printing.

Since the marks 149a and 149b may be disposed abreast at corners in one side to indicate electrodes (for example, lower electrodes) provided in the substrate 151. Thus, through the marks 149a and 149b, polarities (positive (+) or negative (−)) of the lower electrodes 155b and 156b disposed on the lower surface of the substrate 151 may be recognized and may be accurately connected to an external circuit. Lateral surfaces of the wavelength conversion film 145 and the lateral surfaces of the substrate 151 may be substantially flat to be coplanar, but the present disclosure is not limited thereto. In the present exemplary embodiment, the wavelength conversion film 145 may not contain a wavelength conversion material or may be changed into a protective film containing a different functional material.

The package type semiconductor light emitting device may be advantageously applied to a chip scale package (CSP) semiconductor light emitting device. A manufacturing process of this exemplary embodiment may be described with reference to FIGS. 20 through 26.

Figure 20:
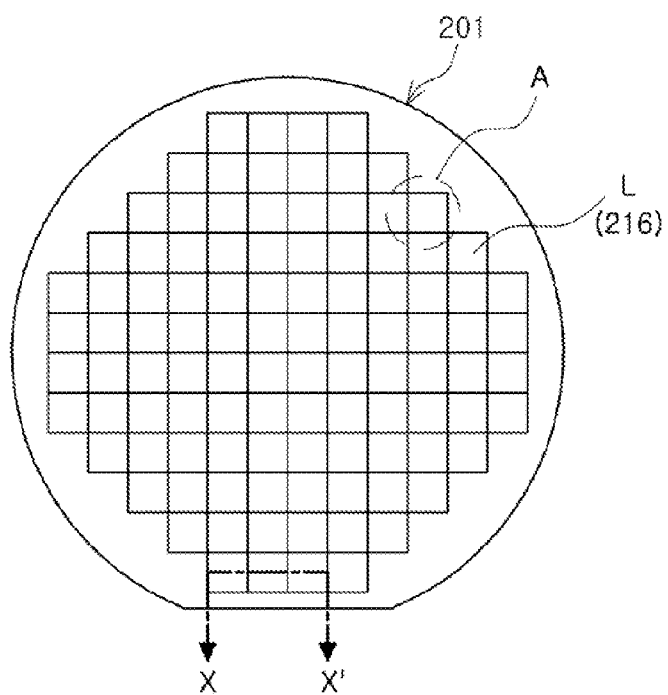
FIG. 20 is a plan view schematically illustrating a wafer for a plurality of semiconductor light emitting devices.
Figure 21:
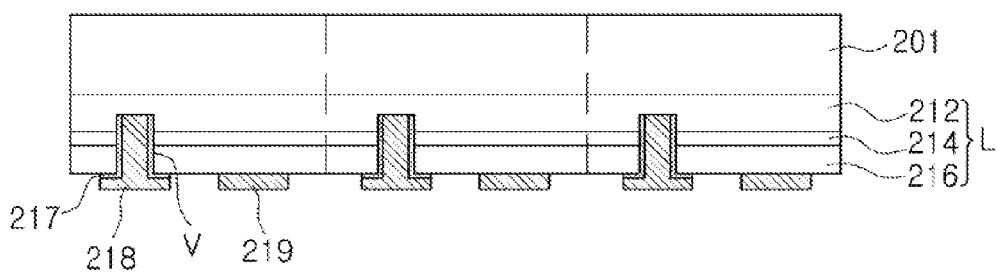
FIGS. 21 through 26 are cross-sectional views illustrating major processes of a method of manufacturing a semiconductor light emitting device according to an exemplary embodiment of the present disclosure.

As illustrated in FIGS. 20 and 21, the manufacturing method may start with operation of preparing a wafer 201 with a semiconductor laminate L formed thereon.

The semiconductor laminate L may be epitaxially formed on the wafer 201 for a plurality of semiconductor light emitting devices. The semiconductor laminate L may include a first conductivity-type semiconductor layer 212, an active layer 214, and a second conductivity-type semiconductor layer 216. The semiconductor laminate L may be a two-dimensional (2D) stacked structure or a three-dimensional (3D) nano-light emitting structure (please refer to FIG. 6) as well.

FIG. 20 is a plan view schematically illustrating the wafer 201 with the semiconductor laminate L formed thereon. As illustrated in FIG. 20, the semiconductor laminate L for individual light emitting devices A may be formed on the wafer 201, and FIGS. 21 through 26 are cross-sectional views taken along line X-X'.

The wafer 201 may be formed of an insulating, conductive, or semiconductor substrate. For example, the waver 201 may be formed of sapphire, SiC, Si, $MgAl_2O_4$, MgO, $LiAlO_2$, $LiGaO_2$, or GaN.

The semiconductor laminate L may be a Group-III nitride semiconductor. For example, the first and second conductivity-type semiconductor layers 212 and 216 may be a nitride single crystal having a composition of $Al_xIn_yGa_{1-x-y}N$ ($0 \leq x<1$, $0 \leq y<1$, $0 \leq x+y<1$). The active layer 214 may have a multi quantum well (MQW) structure in which quantum well layers and quantum barrier layers are alternately stacked. For example, in case of a nitride semiconductor, a GaN/InGaN structure may be used.

The first and second electrodes 218 and 219 may be positioned to be connected to the first and second conductivity-type semiconductor layers 212 and 216, respectively. The first and second electrodes 218 and 219 may be provided in each of individual light emitting device regions.

In the present exemplary embodiment, the first electrode 218 is formed by using a via v connected to the first conductivity-type semiconductor layer 212. An insulating layer 217 is formed within the via v and portions of the surfaces of the semiconductor laminate L to prevent the first electrode 218 from being undesirably connected to the active layer 214 and the second conductivity-type semiconductor layer 216. In this manner, in the present exemplary embodiment, a single first electrode 218 and a single second electrode 219 are formed on the same surface, but according to a chip structure, only an electrode having one polarity may be provided in one surface or two or more electrodes having a least one polarity may be provided.

The first electrode 218 may be surrounded by the insulating layer 217 so as to be electrically separated from the active layer 214 and the second conductivity-type semiconductor layer 216.

The first electrode 218 may be provided in a plurality of vias v formed in rows and columns. The amount of vias and contact areas of the vias v may be adjusted such that a planar area of the plurality of vias in contact with the first conductivity-type semiconductor layer 212 ranges from 1% to 5% of a planar area of the semiconductor laminate L. A radius of the via may range from 5 μm to 50 μm, and the number of vias may range from 1 to 50 per individual chip according to a width of the semiconductor laminate L. Although the number of vias may vary according to an area of an individual chip, preferably, a plurality of vias are provided. A distance between the vias v may range from 100 μm to 500 μm, and the vias may have a matrix structure including rows and columns. More appropriately, the distance between the vias may range from 150 µm to 450 µm. If the distance between the vias is smaller than 100 µm, the number of vias may increase, relatively reducing a light emitting area and lowering luminous efficiency. If the distance between the vias is greater than 500 µm, current spreading may suffer, degrading luminous efficiency. A depth of the via v may range from 0.5 µm to 5.0 µm, although it may vary according to a thickness of the second conductivity-type semiconductor layer 216 and the active layer 214.

Figure 22:
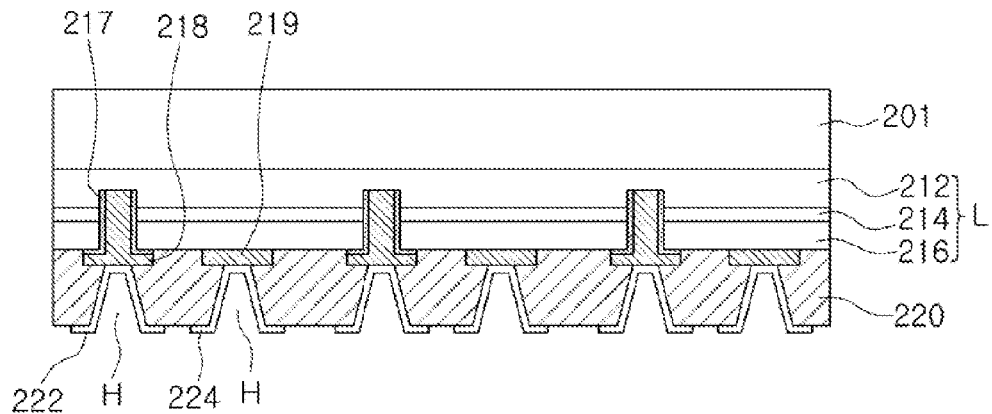

Thereafter, as illustrated in FIG. 22, first and second connection electrodes 222 and 224 may be formed to be connected to electrode portions exposed through through holes H in a support structure 220.

In order to reduce contact resistance, the amount, a shape, a pitch, and a contact area with the first and second conductivity-type semiconductor layers 212 and 216 of the contact hole H may be appropriately regulated. The contact holes H may be arranged in various forms in rows and columns to improve a current flow.

The support structure 220 may be a semiconductor substrate such as a silicon substrate, or may be formed of a curing resin containing highly reflective powder.

The first and second connection electrodes 222 and 224 may extend to partial regions of a lower surface of the support structure 220 along the through holes H from exposed regions of the first and second electrodes 218 and 219, so as to be connected to an external circuit from the lower surface of the support structure 220. The first and second electrodes 222 and 224 may be formed by forming seed layers with a material such as nickel (Ni) or chromium (Cr) and performing a plating process thereon. The first and second electrodes 222 and 224 may be formed of a material such as gold (Au). During this process, the support structure 220 may be bonded to the semiconductor laminate L and the first and second electrodes 222 and 224 may be formed.

Figure 23:
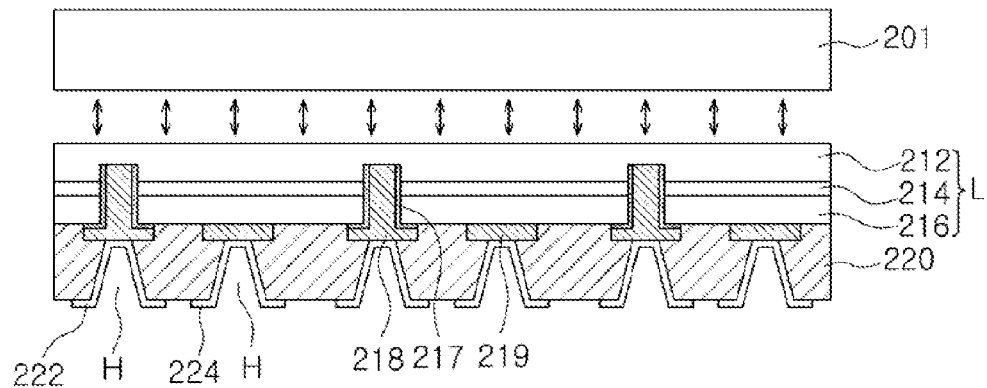

Subsequently, as illustrated in FIG. 23, the wafer 201 used as a growth substrate may be separated from the semiconductor laminate L.

This process may be implemented by using a laser lift-off process, but the present disclosure is not limited thereto and the wafer 201 may be removed through mechanical etching or chemical etching.

Figure 24:
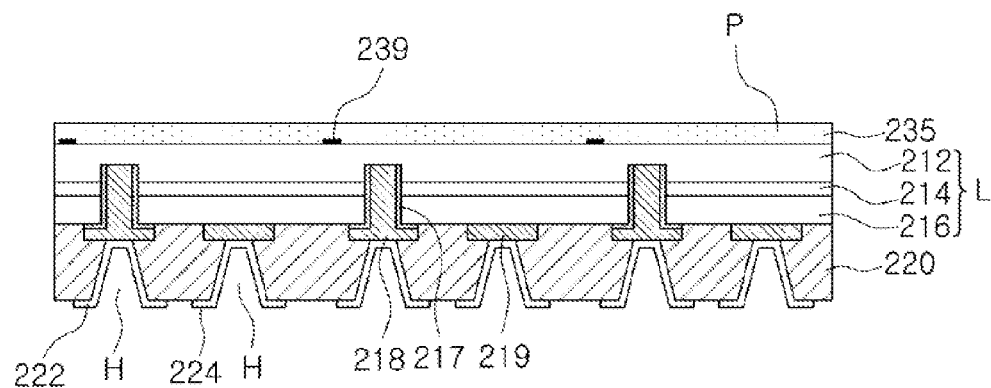

Thereafter, as illustrated in FIG. 24, a wavelength conversion film 235 having marks 239 formed on a surface of the semiconductor laminate L from which the wafer 201 was removed, may be formed.

The wavelength conversion film 235 may be formed of a resin containing a wavelength conversion material P such as a phosphor or a ceramic material containing a wavelength conversion material such as a phosphor. In a specific example, the wavelength conversion film 235 may be glass or an oxide film containing the wavelength conversion material P. In the present exemplary embodiment, the wavelength conversion film 235 is provided as a protective film, but in another exemplary embodiment, a protective film not using a wavelength conversion film may be used. For example, the wavelength conversion material may not be contained, or a resin, glass, an oxide film, or ceramics containing any other functional material may be used.

The marks 239 may be asymmetrically arranged in an individual device region to indicate a direction of a chip, namely, positions of electrodes having particular polarities. The marks 239 may be configured such that they are readily recognized in the opposite surface of the wavelength conversion film 235, although the marks 239 are positioned in the surface of the wavelength conversion film 235 in contact with the semiconductor laminate L. For example, in a case in which the wavelength conversion film 235 is configured as a resin film containing a wavelength conversion material P such as a phosphor or a quantum dot, the wavelength conversion film 235 may be transparent or translucent, and thus, the marks 239 may be easily recognized. Alternatively, if the wavelength conversion film 235 is formed of an opaque material, marks may be printed on a surface different from that of the present exemplary embodiment, or may be formed by using a structure such as a hole as that illustrated in FIG. 1.

Figure 25:
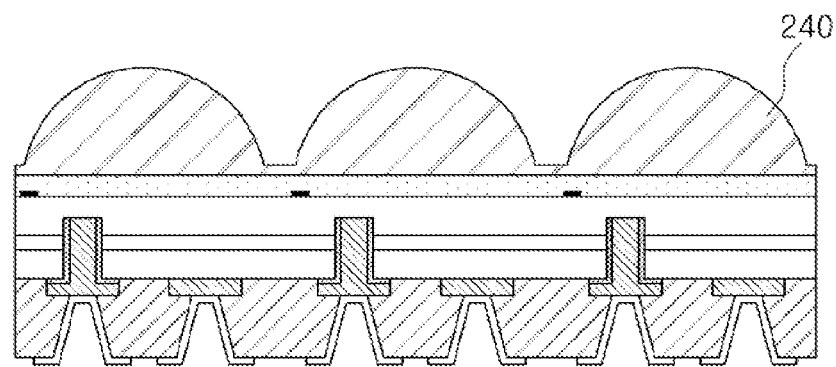
Figure 26:
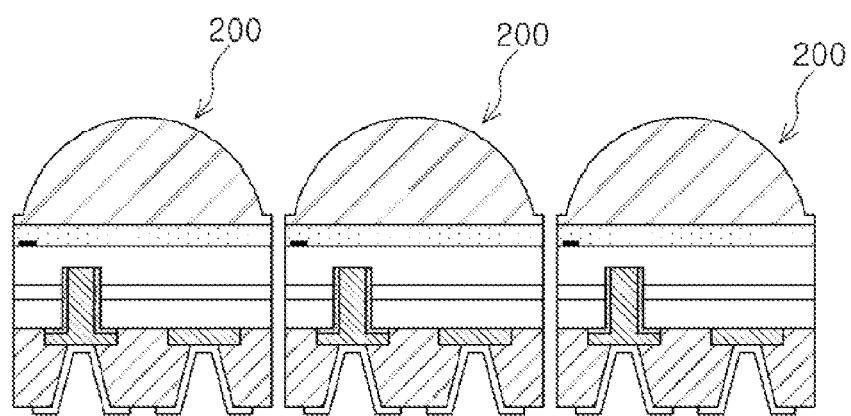

Subsequently, as illustrated in FIG. 25, an optical member 240 such as a lens may be formed on the wavelength conversion film 235 formed in the semiconductor laminate L, as needed. In this example, a convex lens is illustrated as an optical member, but various structures that may change an angle of beam spread may also be employed. The product illustrated in FIG. 25 is cut into individual light emitting device units to obtain chip-scale package type semiconductor light emitting devices 200 as illustrated in FIG. 26.

The semiconductor LED chip employed in various exemplary embodiments of the present disclosure may be an LED emitting blue light. Also, the wavelength conversion film described as an example of a protective film may convert a partial amount of blue light into at least one of yellow, green, red, and orange light, and may be mixed with unconverted blue light to emit white light.

Meanwhile, when the semiconductor LED chip emits ultraviolet light, the wavelength conversion film may include phosphors emitting blue, green, and red light. In this case, a light emitting device may control a color rendering index (CRI) to range from a sodium-vapor (Na) lamp (CRI 40) to sunlight (CRI 100), or the like. Also, the light emitting device may control a color temperature ranging from 2000K to 20000K level to generate various levels of white light. If necessary, the light emitting device may generate visible light having purple, blue, green, red, orange colors, or infrared light to adjust an illumination color according to a surrounding atmosphere or mood. Also, the light emitting device may generate light having a special wavelength stimulating plant growth.

Figure 27:
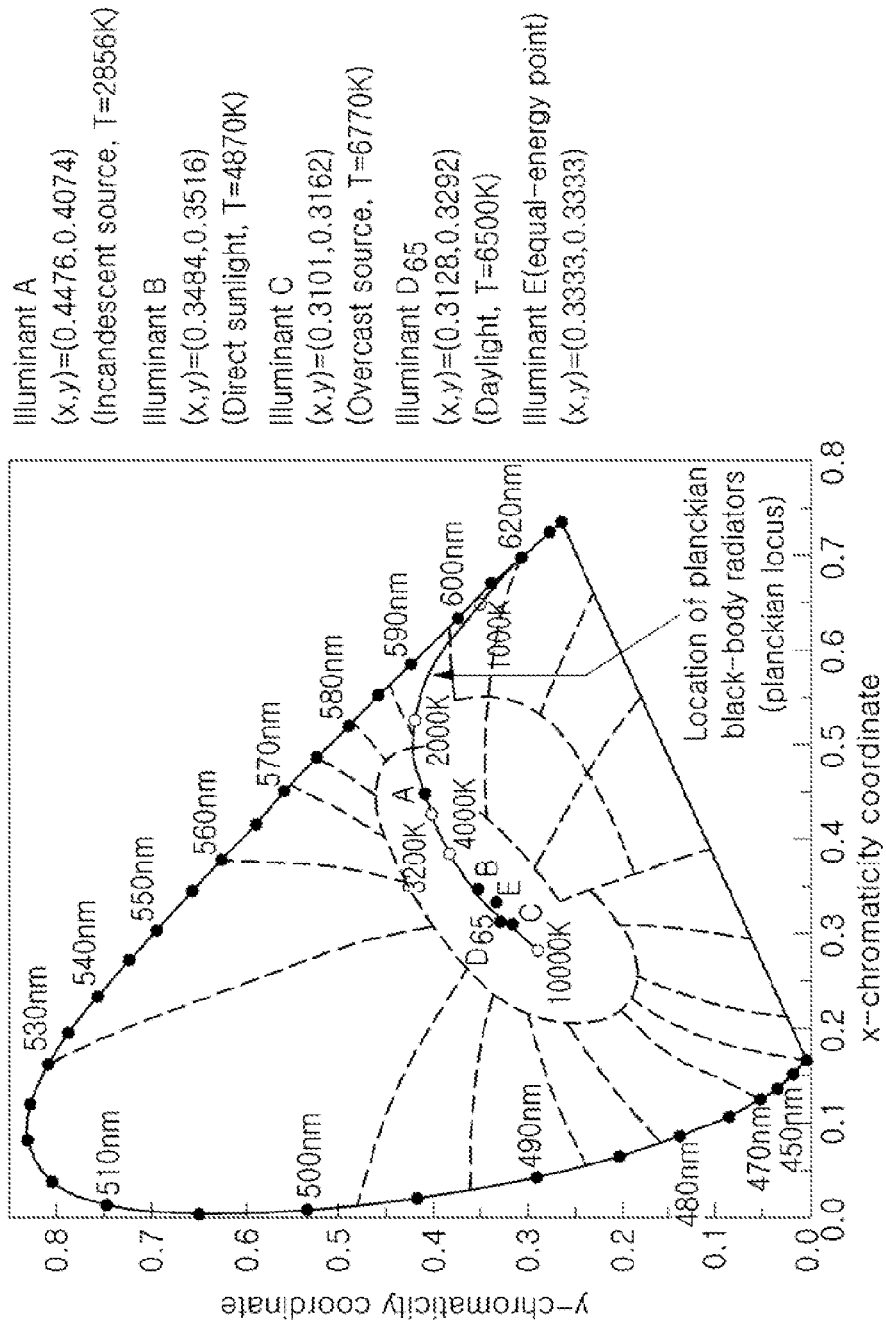
FIG. 27 is a CIE 1931 color space chromaticity diagram illustrating various examples of wavelength conversion materials employable in a wavelength conversion part.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 27. Alternatively, white light may be positioned in a region surrounded by a spectrum of black body radiation and the segment. A color temperature of white light corresponds to a range from about 2000K to about 20000K.

Phosphors may have the following empirical formula and colors.

Oxide-based phosphors: Yellow and green $Y_3Al_5O_{12}$:Ce, $Tb_3Al_5O_{12}$:Ce, $Lu_3Al_5O_{12}$:Ce.

Silicate-based phosphors: Yellow and green $(Ba,Sr)_2SiO_4$:Eu, yellow and orange $(Ba,Sr)_3SiO_5$:Ce.

Nitride-based phosphors: Green β-SiAlON:Eu, yellow $La_3Si_6O_{11}$:Ce, orange α-SiAlON:Eu, red $CaAlSiN_3$, $Sr_2Si_5N_8$:Eu, $SrSiAl_4N_7$:Eu.

Fluoride-based phosphors: KSF-based red $K_2SiF_6$:$Mn^{4+}$.

Phosphor compositions should be basically conformed with stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may implement various colors according to sizes.

Table 1 below shows types of phosphors in applications fields of white light emitting devices using a blue LED (wavelength: 440 nm to 460 nm).

TABLE 1

| Purpose | Phosphors |
| --- | --- |
| LED TV BLU | $\beta$-SiAlON:$Eu^{2+}$ |
| | (Ca,Sr)AlSiN$_3$:$Eu^{2+}$ |
| | La$_3$Si$_6$O$_{11}$:$Ce^{3+}$ |
| | K$_2$SiF$_6$:$Mn^{4+}$ |
| Lighting Devices | Lu$_3$Al$_5$O$_{12}$:$Ce^{3+}$ |
| | Ca-$\alpha$-SiAlON:$Eu^{2+}$ |
| | La$_3$Si$_6$N$_{11}$:$Ce^{3+}$ |
| | (Ca,Sr)AlSiN$_3$:$Eu^{2+}$ |
| | Y$_3$Al$_5$O$_{12}$:$Ce^{3+}$ |
| | K$_2$SiF$_6$:$Mn^{4+}$ |
| Side Viewing | Lu$_3$Al$_5$O$_{12}$:$Ce^{3+}$ |
| (Mobile, Notebook PC) | Ca-$\alpha$-SiAlON:$Eu^{2+}$ |
| | La$_3$Si$_6$N$_{11}$:$Ce^{3+}$ |
| | (Ca,Sr)AlSiN$_3$:$Eu^{2+}$ |
| | Y$_3$Al$_5$O$_{12}$:$Ce^{3+}$ |
| | (Sr,Ba,Ca,Mg)$_2$SiO$_4$:$Eu^{2+}$ |
| | K$_2$SiF$_6$:$Mn^{4+}$ |
| Electrical Components | Lu$_3$Al$_5$O$_{12}$:$Ce^{3+}$ |
| (Vehicle Head Lamp, etc.) | Ca-$\alpha$-SiAlON:$Eu^{2+}$ |
| | La$_3$Si$_6$N$_{11}$:$Ce^{3+}$ |
| | (Ca,Sr)AlSiN$_3$:$Eu^{2+}$ |
| | Y$_3$Al$_5$O$_{12}$:$Ce^{3+}$ |
| | K$_2$SiF$_6$:$Mn^{4+}$ |

Phosphors or quantum dots may be applied by using at least one of a method of spraying them on a light emitting device, a method of covering as a film, and a method of attaching as a sheet of ceramic phosphor, or the like.

As the spraying method, dispensing, spray coating, or the like, is generally used, and dispensing includes a pneumatic method and a mechanical method such as a screw fastening scheme, a linear type fastening scheme, or the like. Through a jetting method, an amount of dotting may be controlled through a very small amount of discharging and color coordinates (or chromaticity) may be controlled therethrough. In the case of a method of collectively applying phosphors on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may have a difference according to whether a lateral surface of a chip is required to be coated or not.

In order to control efficiency of a long wavelength light emitting phosphor re-absorbing light emitted in a short wavelength, among two types of phosphors having different light emitting wavelengths, two types of phosphor layers having different light emitting wavelengths may be provided, and in order to minimize re-absorption and interference of chips and two or more wavelengths, a DBR (ODR) layer may be included between respective layers. In order to form a uniformly coated film, after a phosphor is fabricated as a film or a ceramic form and attached to a chip or a light emitting device.

In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor applying technique plays the most important role in determining light characteristics in an LED device, so techniques of controlling a thickness of a phosphor application layer, a uniform phosphor distribution, and the like, have been variously researched.

A quantum dot (QD) may also be positioned in a light emitting device in the same manner as that of a phosphor, and may be positioned in glass or a light-transmissive polymer material to perform optical conversion.

The light emitting devices as described above are illustrated as a package including a LED chip, but the present inventive concept is not limited thereto. For example, the light emitting devices may be LED chip itself. In this case, the LED chip can be mounted on a board and electrically connected to the board by using a chip bonding or a wire bonding. This may be called as COB (Chip on Board).

Figure 28:
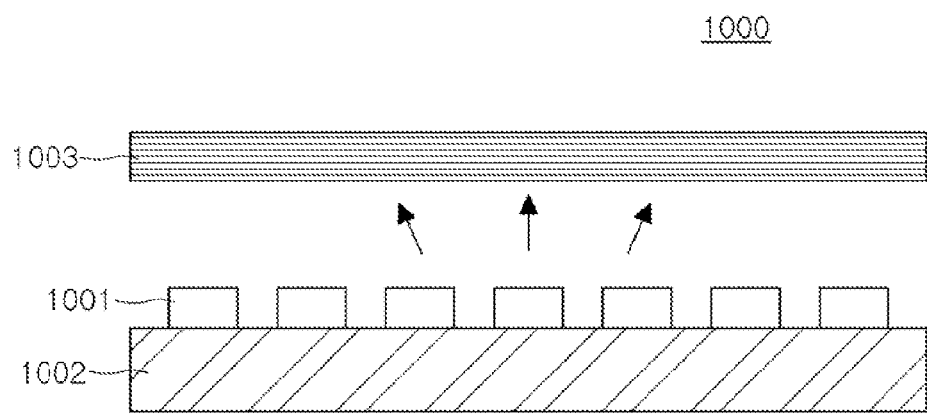
FIGS. 28 and 29 are views illustrating examples of a backlight unit in which a semiconductor light emitting device according to an exemplary embodiment of the present disclosure may be employed.
Figure 29:
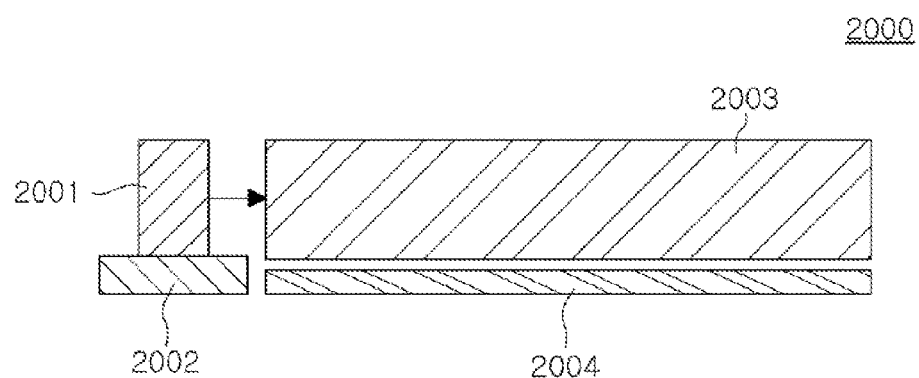

FIGS. 28 and 29 are views illustrating examples of a semiconductor light emitting device and a backlight unit employing a package thereof according to an exemplary embodiment of the present disclosure.

Referring to FIG. 28, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 28 in which the light sources 1001 emit light toward an upper side on which a liquid crystal display is disposed, a backlight unit 2000 as another example illustrated in FIG. 29 is configured such that light sources 2001 mounted on a substrate 2002 emit light in a lateral direction, and the emitted light may be made to be incident to a light guide plate 2003 so as to be converted into a surface light source. Light, passing through the light guide plate 2003, is emitted upwards, and in order to enhance light extraction efficiency, a reflective layer 2004 may be disposed on a lower surface of the light guide plate 2003.

Figure 30:
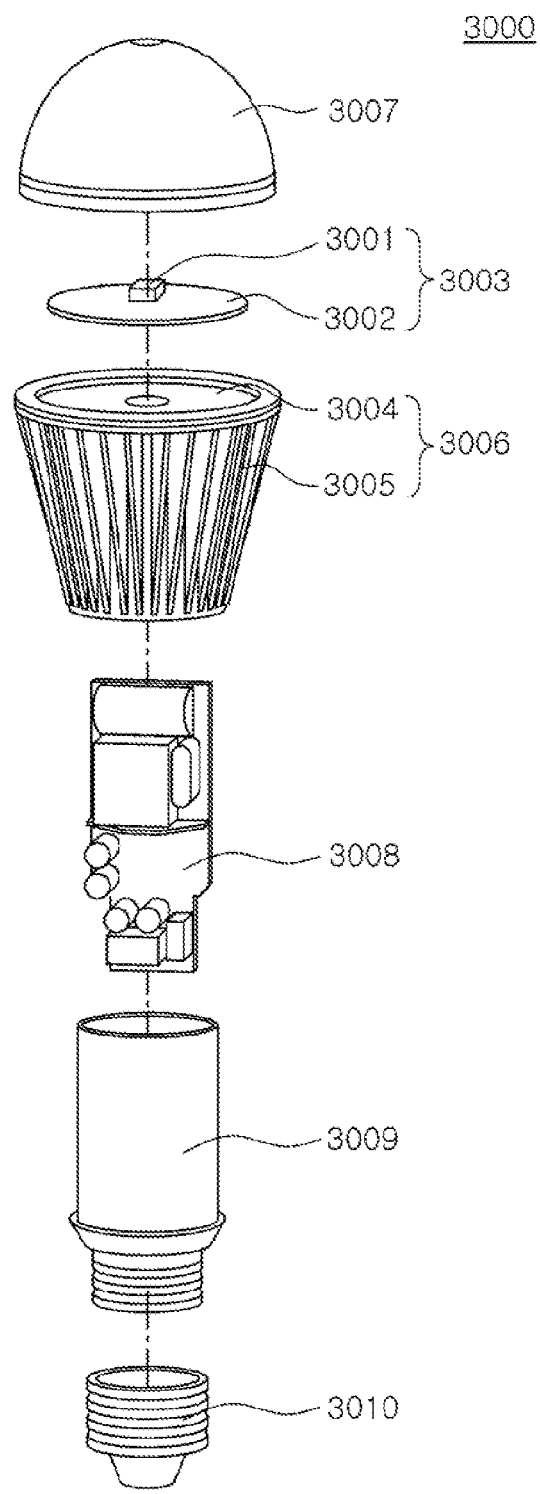
FIG. 30 is a view illustrating an example of a lighting device employing a semiconductor light emitting device according to an exemplary embodiment of the present disclosure.

FIG. 30 is a view illustrating an example of a semiconductor light emitting device according to an exemplary embodiment of the present disclosure.

A lighting device 3000 is illustrated, for example, as a bulb-type lamp in FIG. 21, and includes a light emitting module 3003, a driver 3008, and an external connector 3010. Also, the lighting device 3000 may further include external structures such as external and internal housings 3006 and 3009 and a cover 3007. The light emitting module 3003 may include a light source 3001 having the aforementioned semiconductor light emitting device and a circuit board 3002 with the light source 3001 mounted thereon. For example, first and second electrodes of the aforementioned semiconductor light emitting device may be electrically connected to an electrode pattern of the circuit board 3002. In the present exemplary embodiment, it is illustrated that a single light source 3001 is mounted on the circuit board 3020, but a plurality of light sources may be mounted as needed.

The external housing 3006 may serve as a heat dissipater and may include a heat dissipation plate 3004 disposed to be in direct contact with the light emitting module 3003 to enhance heat dissipation and heat dissipation fins 3005 surrounding the lateral surfaces of the lighting device 3000. Also, the cover 3007 may be installed on the light emitting module 3003 and have a convex lens shape. The driver 3008 is installed in the internal housing 3009 and connected to the external connector 3010 having a socket structure to receive power from an external power source. Also, the driver 3008 may serve to convert power into an appropriate current source for driving the semiconductor light emitting device 3001 of the light emitting module 3003, and provide the same. For example, the driver 3008 may be configured as an AC-DC converter, a rectifying circuit component, or the like.

Figure 31:
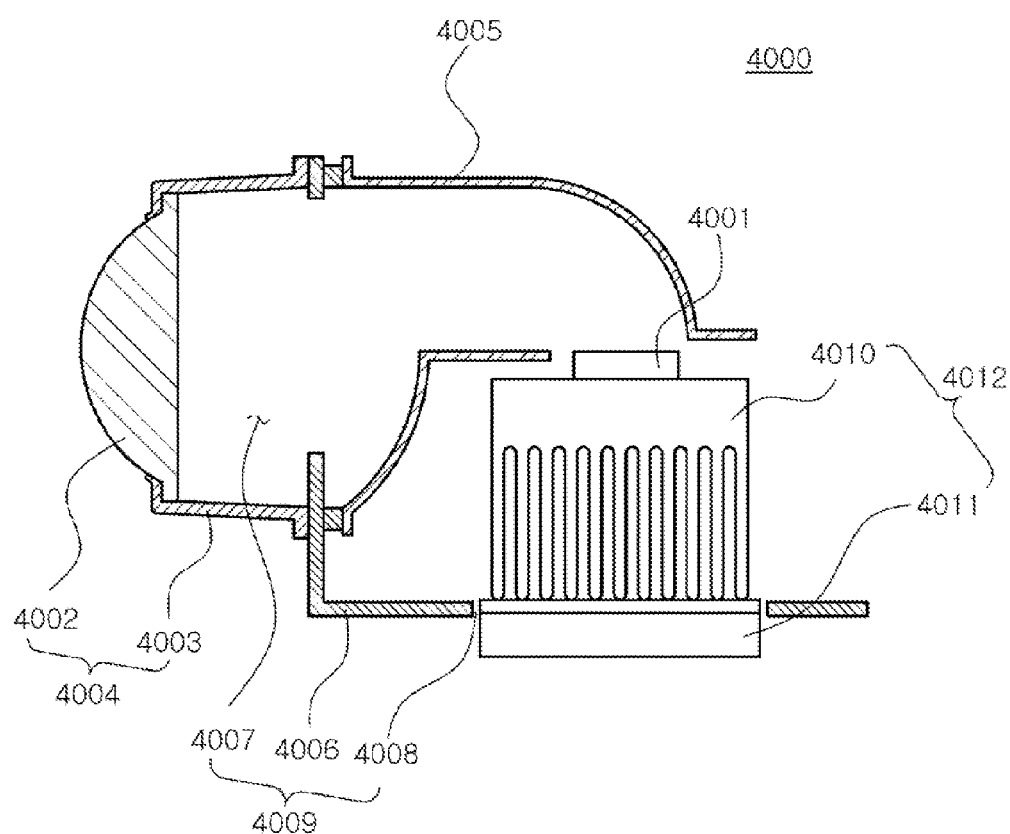
FIG. 31 is a view illustrating an example of a head lamp employing a semiconductor light emitting device according to an exemplary embodiment of the present disclosure.

FIG. 31 is a view illustrating an example of an application of a semiconductor light emitting device or a package thereof according to an exemplary embodiment of the present disclosure to a head lamp.

Referring to FIG. 31, a head lamp 4000 used as a vehicle lamp, or the like, may include a light source 4001, a reflector 4005, and a lens cover4004. The lens cover 4004 may include a hollow guide 4003 and a lens 4002. The light source 4001 may include the aforementioned semiconductor light emitting device or a package including the semiconductor light emitting device.

The head lamp 4000 may further include a heat dissipater 4012 outwardly dissipating heat generated by the light source 4001. In order to effectively dissipate heat, the heat dissipater 4012 may include a heat sink 4010 and a cooling fan 4011. Also, the head lamp 4000 may further include a housing 4009 fixedly supporting the heat dissipater 4012 and the reflector 4005, and the housing 4009 may have a central hole 4008 formed in one surface thereof, in which the heat dissipater 4012 is coupled.

Also, the housing 4009 may have a front hole 4007 formed in the other surface integrally connected to the one surface and bent in a right angle direction. The front hole 4007 may allow the reflector 4005 to be fixedly positioned above the light source 4001. Accordingly, a front side is opened by the reflector 4005, and the reflector 4005 is fixed to the housing 4009 such that the opened front side corresponds to the front hole 4007, and light reflected by the reflector 4005 may pass through the front hole 4007 to be output outwardly.

As set forth above, according to exemplary embodiments of the present disclosure, by adding marks to allow for recognition of a direction of a semiconductor LED chip, a defect in a follow-up process caused as electrodes are not properly connected when mounted on a board due to erroneous recognition of a direction of the electrodes may be prevented. Also, in a specific example, marks may be provided to a protective film member in advance, so as to be utilized as a reference for aligning semiconductor LED chips.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A light emitting device comprising:
    a light emitting diode (LED) chip having a first main surface and a second main surface opposing the first main surface, and one or more side surfaces extending between the first main surface and second main surface;
    a plurality of electrodes disposed on the first main surface;
    a wavelength conversion film disposed on the second main surface, wherein a mark is a hole formed in a peripheral portion of the wavelength conversion film, and
    the mark contains orientation information of the light emitting device, thereby enabling the light emitting device to be properly oriented on a receiving substrate.

2. The light emitting device of claim 1, wherein the hole is filled with a marking material.

3. The light emitting device of claim 2, wherein the marking material is a reflective material.

4. The light emitting device of claim 2, wherein the marking material is a different color than the wavelength conversion film.

5. The light emitting device of claim 1, wherein the mark comprises a colored marking material.

6. The light emitting device of claim 1, wherein the mark comprises an ink.

7. The light emitting device of claim 1, wherein the wavelength conversion film comprises a phosphor film.

8. The light emitting device of claim 1, further comprising a reflective structure surrounding the one or more sides of the LED chip.

9. The light emitting device of claim 8, wherein the reflective structure has a first main surface and a second main surface opposing the first main surface, and
    the first main surface of the LED chip and the first main surface of the reflective structure are substantially coplanar.

10. The light emitting device of claim 8, wherein the reflective structure has a first main surface and an opposing second main surface extending in a first direction, and one or more outer side surfaces extending between the reflective side layer first main surface and second main surface in a second direction substantially perpendicular to the first direction;
    the wavelength conversion film has a first main surface and an opposing second main surface extending in the first direction, and one or more side surfaces extending between the phosphor film first main surface and second main surface in the second direction; and
    said outer side surfaces of the reflective structure and the side surfaces of the wavelength conversion film are substantially aligned in the second direction.

11. The light emitting device of claim 1, further comprising at least one additional mark formed in the peripheral portion of the wavelength conversion film.

12. The light emitting device of claim 8, wherein the reflective structure has a first main surface and an opposing second main surface extending in a first direction, and an opening extending between the first main surface and the second main surface in a second direction substantially perpendicular to said first direction, wherein said opening surrounds the LED chip.

13. The light emitting device of claim 1, wherein the mark is located in a peripheral portion of the wavelength conversion film.

\* \* \* \* \*